(12) United States Patent  
Banhegyesi et al.

(10) Patent No.: US 9,194,898 B2  
(45) Date of Patent: Nov. 24, 2015

(54) INTELLIGENT ELECTRONIC DEVICE AND METHOD THEREOF

(71) Applicant: Electro Industries/Gauge Tech, Westbury, NY (US)

(72) Inventors: Tibor Banhegyesi, Baldwin, NY (US); Erran Kagan, Great Neck, NY (US); Patricia E. Banker, Park Ridge, NJ (US)

(73) Assignee: Electro Industries/Gauge Tech, Westbury, NY (US)

( * ) Notice: Subject to any disclaimer, the term of this patent is extended or adjusted under 35 U.S.C. 154(b) by 0 days.

(21) Appl. No.: 14/103,250

(22) Filed: Dec. 11, 2013

(65) Prior Publication Data

US 2014/0100801 A1 Apr. 10, 2014

Related U.S. Application Data

(63) Continuation of application No. 13/315,521, filed on Dec. 9, 2011, now Pat. No. 8,620,608, which is a continuation of application No. 12/056,955, filed on Mar. 27, 2008, now Pat. No. 8,078,418, which is a (Continued)

(51) Int. Cl.
*G01R 21/133* (2006.01)
*G01D 4/00* (2006.01)
*G01R 22/10* (2006.01)

(52) U.S. Cl.
CPC .............. *G01R 21/133* (2013.01); *G01D 4/004* (2013.01); *G01R 22/10* (2013.01); *Y02B 90/242* (2013.01); *Y04S 20/322* (2013.01)

(58) Field of Classification Search
CPC ...................................................... G01R 21/133
USPC ............................................................. 702/61
See application file for complete search history.

(56) References Cited

U.S. PATENT DOCUMENTS

| 2,900,605 | A | 8/1959 | Squires et al. |
| 2,992,365 | A | 7/1961 | Brill |
| 3,084,863 | A | 4/1963 | Du Vall |
| 3,205,439 | A | 9/1965 | Sangi et al. |
| 3,333,194 | A | 7/1967 | Batcher |

(Continued)

FOREIGN PATENT DOCUMENTS

| JP | 08-247783 | 9/1996 |
| WO | WO 98/54583 | 12/1998 |
| WO | WO 01/55733 | 8/2001 |

OTHER PUBLICATIONS

7700 Ion 3-Phase Power Meter, Analyzer and Controller, pp. 1-10, Dec. 8, 1998.

(Continued)

*Primary Examiner* — Bryan Bui
(74) *Attorney, Agent, or Firm* — Gerald E. Hespos; Michael J. Porco; Matthew T. Hespos

(57) ABSTRACT

An intelligent electronic device (IED) having a gain control unit adapted to selectively regulate operating ranges of output signals of a sensing circuit of the device is described. In one embodiment, the IED is a digital electric power and energy meter, which operating ranges for supply voltages and supply currents of electrical services may be adjusted to match predetermined ranges for input signals of a data acquisition system or a data processing module of the meter.

20 Claims, 32 Drawing Sheets

Related U.S. Application Data continuation-in-part of application No. 12/036,356, filed on Feb. 25, 2008, now Pat. No. 7,899,630, which is a continuation of application No. 11/341,802, filed on Jan. 27, 2006, now Pat. No. 7,337,081.

(60) Provisional application No. 60/647,669, filed on Jan. 27, 2005, provisional application No. 60/920,198, filed on Mar. 27, 2007.

(56) References Cited

U.S. PATENT DOCUMENTS

| | | |
|---|---|---|
| 3,458,810 A | 7/1969 | Wald |
| 3,535,637 A | 10/1970 | Goransson |
| 3,737,891 A | 6/1973 | Metcalf |
| 3,824,441 A | 7/1974 | Heyman et al. |
| 4,066,960 A | 1/1978 | Milkovic |
| 4,077,061 A | 2/1978 | Johnston et al. |
| 4,158,810 A | 6/1979 | Leskovar |
| 4,182,983 A | 1/1980 | Heinrich et al. |
| 4,240,149 A | 12/1980 | Fletcher et al. |
| 4,283,772 A | 8/1981 | Johnston |
| 4,345,311 A | 8/1982 | Fielden |
| 4,360,879 A | 11/1982 | Cameron |
| 4,415,896 A | 11/1983 | Allgood |
| 4,437,059 A | 3/1984 | Hauptmann |
| 4,442,492 A | 4/1984 | Karlsson et al. |
| 4,463,311 A | 7/1984 | Kobayashi |
| 4,486,707 A | 12/1984 | Randall et al. |
| 4,608,533 A | 8/1986 | Starkie |
| 4,689,752 A | 8/1987 | Fernandes et al. |
| 4,709,339 A | 11/1987 | Fernandes |
| 4,713,608 A | 12/1987 | Catiller et al. |
| 4,713,609 A | 12/1987 | Losapio et al. |
| 4,742,296 A | 5/1988 | Petr et al. |
| 4,799,008 A | 1/1989 | Kannari |
| 4,804,957 A | 2/1989 | Selph et al. |
| 4,839,819 A | 6/1989 | Begin et al. |
| 4,843,311 A | 6/1989 | Rozman et al. |
| 4,884,021 A | 11/1989 | Hammond et al. |
| 4,902,965 A | 2/1990 | Bodrug et al. |
| 4,933,633 A | 6/1990 | Allgood |
| 4,949,029 A | 8/1990 | Cooper et al. |
| 4,958,294 A | 9/1990 | Herscher et al. |
| 4,979,122 A | 12/1990 | Davis et al. |
| 4,989,155 A | 1/1991 | Begin et al. |
| 4,996,646 A | 2/1991 | Farrington |
| 4,999,572 A | 3/1991 | Bickford et al. |
| 5,006,790 A | 4/1991 | Beverly, II et al. |
| 5,014,229 A | 5/1991 | Mofachern |
| 5,017,860 A | 5/1991 | Germer et al. |
| 5,079,715 A | 1/1992 | Venkataraman et al. |
| 5,122,735 A | 6/1992 | Porter et al. |
| 5,132,609 A | 7/1992 | Nguyen |
| 5,132,610 A | 7/1992 | Ying-Chang |
| 5,170,115 A | 12/1992 | Kashiwabara et al. |
| 5,170,360 A | 12/1992 | Porter et al. |
| 5,212,441 A | 5/1993 | McEachern et al. |
| 5,224,054 A | 6/1993 | Wallis |
| 5,229,713 A | 7/1993 | Bullock et al. |
| 5,233,538 A | 8/1993 | Wallis |
| 5,243,536 A | 9/1993 | Bradford |
| 5,245,275 A | 9/1993 | Germer et al. |
| 5,248,935 A | 9/1993 | Sakoyama et al. |
| 5,248,967 A | 9/1993 | Daneshfar |
| 5,258,704 A | 11/1993 | Germer et al. |
| 5,289,115 A | 2/1994 | Germer et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,301,121 A | 4/1994 | Garverick et al. |
| 5,302,890 A | 4/1994 | McEachern et al. |
| 5,307,009 A | 4/1994 | McEachern et al. |
| 5,343,143 A | 8/1994 | Voisine et al. |
| 5,347,464 A | 9/1994 | McEachern et al. |
| 5,391,983 A | 2/1995 | Lusignan et al. |
| 5,406,495 A | 4/1995 | Hill |
| 5,442,279 A | 8/1995 | Kitayoshi et al. |
| 5,450,007 A | 9/1995 | Payne et al. |
| 5,453,697 A | 9/1995 | Schweer et al. |
| 5,459,459 A | 10/1995 | Lee, Jr. |
| 5,514,958 A | 5/1996 | Germer |
| 5,528,507 A | 6/1996 | McNamara et al. |
| 5,537,340 A | 7/1996 | Gawlik |
| 5,548,527 A | 8/1996 | Hemminger et al. |
| 5,555,508 A | 9/1996 | Munday et al. |
| 5,563,506 A | 10/1996 | Fielden et al. |
| 5,574,654 A | 11/1996 | Bingham et al. |
| 5,606,510 A | 2/1997 | Glaser et al. |
| 5,619,142 A | 4/1997 | Schweer et al. |
| 5,627,759 A | 5/1997 | Bearden et al. |
| 5,642,300 A | 6/1997 | Gubisch et al. |
| 5,650,936 A | 7/1997 | Loucks et al. |
| 5,706,214 A | 1/1998 | Putt et al. |
| 5,734,571 A | 3/1998 | Pilz et al. |
| 5,736,847 A | 4/1998 | Van Doorn et al. |
| 5,737,231 A | 4/1998 | Pyle et al. |
| 5,768,632 A | 6/1998 | Husted et al. |
| 5,828,576 A | 10/1998 | Loucks et al. |
| 5,862,391 A | 1/1999 | Salas et al. |
| 5,896,547 A | 4/1999 | Lee |
| 5,897,607 A | 4/1999 | Jenney et al. |
| 5,907,238 A | 5/1999 | Owerko et al. |
| 5,933,029 A | 8/1999 | Kuroda et al. |
| 5,963,734 A | 10/1999 | Ackerman et al. |
| 5,994,892 A | 11/1999 | Turino et al. |
| 5,995,911 A | 11/1999 | Hart |
| 6,018,690 A | 1/2000 | Saito et al. |
| 6,023,160 A | 2/2000 | Coburn |
| 6,032,109 A | 2/2000 | Ritmiller et al. |
| 6,064,192 A | 5/2000 | Redmyer |
| 6,098,175 A | 8/2000 | Lee |
| 6,133,720 A | 10/2000 | Elmore |
| 6,163,243 A | 12/2000 | Titus |
| 6,167,329 A | 12/2000 | Engel et al. |
| 6,185,508 B1 | 2/2001 | Van Doorn et al. |
| 6,262,672 B1 | 7/2001 | Brooksby et al. |
| 6,269,316 B1 | 7/2001 | Hubbard et al. |
| 6,374,084 B1 | 4/2002 | Fok |
| 6,401,054 B1 | 6/2002 | Andersen |
| 6,429,637 B1 | 8/2002 | Gandhi |
| 6,528,957 B1 | 3/2003 | Luchaco |
| 6,590,380 B2 | 7/2003 | Edel |
| 6,611,773 B2 * | 8/2003 | Przydatek et al. ............... 702/62 |
| 6,671,635 B1 | 12/2003 | Forth et al. |
| 6,687,627 B1 | 2/2004 | Gunn et al. |
| 6,694,270 B2 | 2/2004 | Hart |
| 6,714,881 B2 | 3/2004 | Carlson et al. |
| 6,717,394 B2 * | 4/2004 | Elms ......................... 324/76.39 |
| 6,735,535 B1 | 5/2004 | Kagan et al. |
| 6,757,628 B1 | 6/2004 | Anderson et al. |
| 6,759,837 B2 | 7/2004 | Gandhi |
| 6,988,043 B1 | 1/2006 | Randall |
| 7,174,261 B2 | 2/2007 | Gunn et al. |
| 7,191,076 B2 | 3/2007 | Huber et al. |
| 7,305,310 B2 | 12/2007 | Slota et al. |
| 7,337,081 B1 | 2/2008 | Kagan |
| 7,359,809 B2 | 4/2008 | Bruno |
| 7,511,468 B2 | 3/2009 | McEachern et al. |
| 7,660,682 B2 | 2/2010 | Slota et al. |
| 7,877,169 B2 | 1/2011 | Slota et al. |
| 7,916,060 B2 | 3/2011 | Zhu et al. |
| 7,996,171 B2 | 8/2011 | Banhegyesi |
| 8,073,642 B2 | 12/2011 | Slota et al. |
| 8,078,418 B2 * | 12/2011 | Banhegyesi et al. ............ 702/64 |
| 8,160,824 B2 * | 4/2012 | Spanier et al. .................. 702/57 |
| 2002/0180420 A1 | 12/2002 | Lavoie et al. |
| 2003/0178985 A1 | 9/2003 | Briese et al. |
| 2003/0187550 A1 | 10/2003 | Wilson et al. |
| 2004/0183522 A1 | 9/2004 | Gunn et al. |

(56) References Cited

U.S. PATENT DOCUMENTS

| | | | |
|---|---|---|---|
| 2005/0071106 | A1 | 3/2005 | Huber et al. |
| 2005/0165585 | A1 | 7/2005 | Bhateja et al. |
| 2005/0240362 | A1 | 10/2005 | Randall |
| 2005/0288876 | A1 | 12/2005 | Doig et al. |
| 2006/0095219 | A1 | 5/2006 | Bruno |
| 2008/0075194 | A1 | 3/2008 | Ravi et al. |
| 2008/0147334 | A1 | 6/2008 | Kagan |
| 2008/0172192 | A1 | 7/2008 | Banhegyesi et al. |
| 2008/0215264 | A1* | 9/2008 | Spanier et al. ............ 702/62 |
| 2008/0234957 | A1 | 9/2008 | Banhegyesi et al. |
| 2008/0238406 | A1 | 10/2008 | Banhegyesi et al. |
| 2008/0238713 | A1 | 10/2008 | Banhegyesi et al. |
| 2009/0228224 | A1 | 9/2009 | Spanier et al. |
| 2010/0324845 | A1 | 12/2010 | Spanier et al. |
| 2011/0260710 | A1 | 10/2011 | Zhu et al. |

OTHER PUBLICATIONS

ION Technology, 7500 ION High Visibility 3-Phase Energy & Power Quality Meter, Power Measurement, specification, pp. 1-8, revision date Mar. 21, 2000.

ION Technology 7500 ION 7600 ION High Visibility Energy and Power Quality Compliance Meters, specification, Power Measurement, pp. 1-8, revision date Nov. 30, 2000.

User' Installation & Operation and User's Programming Manual, The Futura Series, Electro Industries, pp. 1-64, (c) 1995.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure(r) Technology, Electro Industries/Gauge Tech, specification, 16 pages, Nov. 1999.

Performance Power Meter & Data Acquisition Node, Electro Industries/Gauge Tech, Nexus 1250 specification, 8 pages, Dec. 14, 2000.

Futura+Series, "Advanced Power Monitoring and Analysis for the 21st Century", Electro Industries/Gauge Tech, specification, 8 pages, Apr. 13, 2000.

PowerLogic Series 4000 Circuit Monitors, pp. 1-4; Document #3020HO0601; Jan. 2006.

ION7550/ion7650 PowerLogic power-monitoring units, Technical data sheets, Copyright 2006 Schneider Electric.

European Standard EN-50160; "Voltage characteristics of electricity supplied by public distribution networks"; Copyright 2007 CENELEC; published Oct. 31, 2007; pp. 1-23.

The Dranetz Field Handbook for Power quality Analysis; Dranetz Technologies Incorporated, Edison, NJ; Copyright 1991; pp. 1-271.

International Standard IEC-1180-1; "High-voltage test techniques for low-voltage equipment"; Copyright Commission Electrotechnique Commission 1992; Geneva, Switzerland; pp. 1-62.

International Standard IEC-61000-2-4, Second Edition; "Electromagnetic compatibility (EMC)—Part 2-4:Enviroment-Compatbility levels in industrial plants for low-frequency conducted distribances"; Copyright Commission Electrotechnique Commission 2002; Geneva, Switzerland; pp. 1-84.

International Standard IEC-61000-4-7, Second Edition; "Electromagnetic compatibility (EMC)—Part 4-7:Testing and measurement techniques"; Copyright Commission Electrotechnique Commission 2002; Geneva, Switzerland; pp. 1-80.

International Standard IEC-61000-4-30, First Edition; "Electromagnetic compatibility (EMC)—Part 4-30:Testing and measurement techniques—Power quality measurement methods"; Copyright Commission Electrotechnique Commission 2003; Geneva, Switzerland; pp. 1-98.

International Standard IEC-687, Second Edition; "Alternating current static watt-hours meters for active energy"; Copyright Commission Electrotechnique Commission 1992; Geneva, Switzerland; pp. 1-36.

IEEE Std 519-1992; IEEE Recommended Practices and Requirements for Harmonic Control in Electrical Power Systems; Copyright The Institute of Electrical and Electronics Engineers, Inc. 1993; New York, NY; pp. 1-101.

IEEE Std 1159-1995; IEEE Recommended Practice for monitoring Electric Power Quality; Copyright The Institute of Electrical and Electronics Engineers, Inc. 1995; New York, NY; pp. 1-76.

"Power Quality—A guide to voltage fluctuation and light flicker"; BChydro Power Smart, Vancouver, B.C., Canada; Dated Mar. 2005; pp. 1-12.

European Standard EN-61000-4-15; "Electromagnetic compatibility (EMC)—Part 4:Testing and measurement techniques, section 15—Flickermeter—Functional and design specifications (IEC 61000-4-15:1997)"; Copyright CENELEC Apr. 1998, Brussels; pp. 1-25.

Manual, "3300 ACM, Economical Digital Power Meter/Transducer—Installation and Operation Manual, Power Measurement, Ltd.", 1999, pp. 79.

Brochure, Sentinel TM Electronic "Multimeasurement Meter," Schlumberger, Mar. 2001, 4 pages.

ION 7550/ION7650 User Guide Power Measuremen—Revision Date Aug. 31, 2004.

6200 ION, Installation & Basic Setup Instructions, (c)Power Measurement Ltd., Revision Date Apr. 25, 2001, 50 pages.

ION(R) Technology, Meter Shop User's Guide, (c)Power Measurement Ltd., Revision Date May 10, 2001, 48 pages.

Electro Industries/Gauge Tech DM Series—specification brochure, "DMMS 425 Low-Cost Multifunction Power Monitoring Outperforms All Others in its Class", 4 pages.

http://www.landisgyrus/Landis_Gyr/Meters/2510_socket_meter.asp, Apr. 18, 2005, 25 pages.

Nagura et al., "Correction method for a single chip power meter", May 10-12, 1994, IEEE, 1994 IEEE Instrumentation and Measurement Technology Conference, 1994. ITMC/94.

8400 ION/8500 Ion Instruction Leaflet, Power Measurement, pp. 1-8, Oct. 1999.

Ramboz, J.D. And Petersons, O., Nist Measurement Services: A Calibration Service for Current Transformers, U.S. Dept. of Commerce, National Institute of Standards and Tech., U.S. Gov. PMtg. Ofc., Jun. 1991.

3720 ACM, 3-phase Power Instruction Package, Power Measurement, specification, 8 pages, revision date Dec. 16, 1998.

3720 ACM, Installation & Operation Manual, Power Measurement, 67 pages, revision date Apr. 4, 2000.

Ion Technology 8500 ION. 8400 ION Advanced Socket-Mount Meter, specification, Power Measurement, pp. 1-12, revision date Dec. 3, 1999.

ION Technology 7700 ION 3-Phase Power Meter, Analyzer and Controller, Power Measurement, specification, pp. 1-10, revision date Dec. 8, 1998.

ION Technology 7700 ION Installation & Operation Manual, Power Measurement, revision date Nov. 20, 1996.

8500 ION Technical Documentation, 8500 ION and 8500 ION-PQ Advanced Intelligent Billing Meters, specification, Power Measurement, revision date Apr. 15, 1999.

* cited by examiner

INTELLIGENT ELECTRONIC DEVICE AND METHOD THEREOF

CROSS-REFERENCE TO RELATED PATENT APPLICATIONS

This application is a continuation-in-part application of U.S. patent application Ser. No. 12/036,356 filed on Feb. 25, 2008, which is a continuation application of U.S. patent application Ser. No. 11/341,802 filed on Jan. 27, 2006 entitled "METERING DEVICE WITH CONTROL FUNCTIONALITY AND METHOD THEREOF", now U.S. Pat. No. 7,337,081, which claims priority to U.S. Provisional Patent Application Ser. No. 60/647,669 filed on Jan. 27, 2005, the contents of both of which are hereby incorporated by reference in their entireties.

This application also claims priority to U.S. Provisional Patent Application No. 60/920,198, filed on Mar. 27, 2007, which is herein incorporated by reference.

FIELD OF THE INVENTION

The present disclosure relates generally to the field of intelligent electronic devices for electrical utility services and, more specifically, to digital electrical power and energy meters for the electrical utility services.

BACKGROUND OF THE INVENTION

Electrical utilities gradually replace traditional means for managing and controlling the distribution and consumption of electrical power to industrial and residential customers with intelligent electronic devices ("IEDs"), such as digital electric power and energy meters, Programmable Logic Controllers ("PLCs"), electronically-controlled Remote Terminal Units ("RTUs"), protective relays, fault recorders, and the like. In operation, the IEDs provide a broad selection of monitoring and metering functions and may be accessed via electronic or fiber-optic means of communications.

While it is efficient to use a single model of a respective IED by different groups of customers or in different electrical networks, exposure of the IED to multiple ranges of supply voltages and currents may have a detrimental effect on its operability and/or accuracy of the measurements performed by the IED.

Therefore, further improvements in the intelligent electronic devices would be desirable.

SUMMARY

One aspect of the present disclosure provides a digital electrical power and energy meter having a gain control unit adapted to selectively regulate operating ranges of output signals of a sensing circuit of the meter. In operation, the operating ranges corresponding to supply voltages and supply currents of different electrical services may be adjusted to match pre-determined ranges for input signals of a data acquisition system or a data processing module of the meter. In one embodiment, the adjustments are performed dynamically, during monitoring the respective electrical service or load.

According to an aspect of the present disclosure, an intelligent electronic device, e.g., a power or energy meter, is provided including a metering module including: a sensing circuit adapted for monitoring supply voltages or supply currents of an AC electrical service, the sensing circuit having voltage sensors and current sensors; a gain control unit coupled to the sensing circuit and adapted for selectively adjusting amplitudes of output signals of the sensing circuit; and a data acquisition system coupled to the gain control unit; and a processing module adapted for processing data obtained using the metering module, wherein the gain control unit is adapted for matching operating ranges of the output signals of the sensing circuit with at least one pre-determined range for input signals of the data acquisition system. The gain control unit includes a plurality of gain-controlled amplifiers which gain factors are selectively controlled using feedback signals generated by the data acquisition system or the processing module, wherein the gain factors are selectively determined for output signals of the voltage sensors or output signals of the current sensors. At least a portion of the gain factors is selectively determined prior to measuring the supply voltages or the supply currents or determined substantially simultaneously with measurements of the supply voltages or the supply currents. The at least one pre-determined range includes a pre-determined range for voltages and a pre-determined range for currents, wherein the pre-determined range for the voltages corresponds to the supply voltages of about 0 to 150V and the pre-determined range for the currents corresponds to the supply currents of about 0 to 2 A.

In another aspect of the present disclosure, the device is selected from the group consisting of a digital electrical power and energy meter, a Programmable Logic Controller (PLC), a Remote Terminal Unit, a protective relay, or a fault recorder.

In a further aspect, a method of measuring supply voltages and currents of an AC electrical service using an intelligent electronic device includes (a) monitoring the supply voltages or the supply currents using a sensing circuit of the device; and (b) selectively adjusting operating ranges of at least a portion of output signals of the sensing circuit to match at least one pre-determined range for input signals of a data acquisition system of the device, wherein the at least one pre-determined range includes a pre-determined range for voltages and a pre-determined range for currents. A computer readable medium storing a program code that, when executed by a computer, facilitates execution of the method or portions thereof is also provided.

In a still further aspect of the present disclosure, an intelligent electronic device is provided including a metering module adapted for measuring or calculating at least one parameter of an AC electrical service; and a processing module adapted for processing data obtained using the metering module; wherein the processing module is adapted for performing calibrating measurements of the at least one parameter in a plurality of calibrating points, wherein the at least one parameter is a supply voltage or a supply current. The calibrating points include (i) 69V, 120V, 220V, and 480V for the supply voltage and (ii) 250 mA, 500 mA, 1 A, and 5 A for the supply current. The calibrating measurements are performed using certified sources of the at least one parameter. The results of measuring or calculating the at least one parameter are linearly interpolated using data of the calibrating measurements at the calibrating points adjacent to a data point of the at least one parameter. Furthermore, the processing module is further adapted for performing the calibrating measurements of the at least one parameter at a plurality of calibrating frequencies, wherein results of measuring or calculating the at least one parameter are linearly interpolated using data of the calibrating measurements performed at the calibrating frequencies adjacent to an AC frequency of the AC electrical service. The plurality of the calibrating frequencies includes 50 Hz and 60 Hz. The device further includes a communication module adapted for transmitting to a remote terminal results of the calibrating measurements or results of measuring or calculating the at least one parameter.

In another aspect, a method of measuring at least one parameter of an AC electrical service using an intelligent electronic device includes performing calibrating measurements of the at least one parameter in a plurality of calibrating points using certified sources of the at least one parameter; and linearly interpolating results of measuring the at least one parameter using data of the calibrating measurements performed at the calibrating points adjacent to a data point of the at least one parameter, wherein the at least one parameter is a supply voltage or a supply current. In other aspects, the method further includes performing the calibrating measurements of the at least one parameter at a plurality of calibrating frequencies, and linearly interpolating results of measuring the at least one parameter using data of the calibrating measurements performed at the calibrating frequencies adjacent to an AC frequency of the AC electrical service.

According to a further aspect of the present disclosure, an intelligent electronic device is provided including a metering module adapted for measuring or calculating at least one parameter of an AC electrical service; and a processing module adapted for processing data obtained using the metering module; wherein the metering and processing modules form (i) first measuring channels time-locked to zero-crossing points of supply voltages or supply currents of the AC electrical service, and (ii) second measuring channels time-locked to pre-determined moments of time. The zero-crossing points are moments of time when a polarity of the supply voltages or the supply currents changes from a negative polarity to a positive polarity or when a polarity of the supply voltages or the supply currents changes from a positive polarity to a negative polarity. The first measuring channels are adapted for measuring or calculating the at least one parameter during a pre-determined number of cycles of an AC frequency of the AC electrical service and the second measuring channels are adapted for measuring or calculating the at least one parameter during a pre-determined time interval.

In a further aspect, the first measuring channels are adapted for measuring or calculating numerical values of the at least one parameter selected from the group consisting of a line voltage, a line current, a phase voltage, a phase current, or a root mean square (RMS) value thereof; energy, revenue, real power, reactive power, total power, and a power factor and the second measuring channels are adapted for measuring or calculating the at least one parameter selected from the group consisting of a waveform of a line voltage, a waveform of a line current, a waveform of a phase voltage, a waveform of a phase current; and a total harmonic distortion or harmonics thereof.

A method of measuring or calculating at least one parameter of an AC electrical service using an intelligent electronic device is provided including (a) forming first measuring channels time-locked to zero-crossing points of supply voltages or supply currents of the AC electrical service; and (b) forming second measuring channels time-locked to pre-determined moments of time. The zero-crossing points are moments of time when a polarity of the supply voltages or the supply currents changes from a negative polarity to a positive polarity or when a polarity of the supply voltages or the supply currents changes from a positive polarity to a negative polarity. In one aspect, step (a) includes measuring or calculating the at least one parameter during a pre-determined number of cycles of an AC frequency of the AC electrical service, wherein the at least one parameter is selected from the group consisting of a line voltage, a line current, a phase voltage, a phase current, or a root mean square (RMS) value thereof; energy, revenue, real power, reactive power, total power, and a power factor. In a different aspect, the step (a) includes measuring or calculating the at least one parameter during a pre-determined time interval, wherein the at least one parameter is selected from the group consisting of a waveform of a line voltage, a waveform of a line current, a waveform of a phase voltage, a waveform of a phase current; and a total harmonic distortion or harmonics thereof. A computer readable medium storing a program code that, when executed by a computer, facilitates execution of the method of or portions thereof is also provided.

In a still further aspect, an intelligent electronic device includes a metering module adapted for measuring or calculating at least one parameter of an AC electrical service; a processing module adapted for administering operation of the device and processing data obtained using the metering module; and a user interface unit adapted for displaying results of measuring or calculating the at least one parameter or configuration settings of the device, wherein (i) the user interface unit is coupled to the processing module using a serial data interface and (ii) the user interface unit comprises a decoder of instructions received via the serial data interface and a display adapted for displaying alphanumeric information contained in said instructions. In one aspect, the alphanumeric information comprises a pre-determined portion of the results of measuring or calculating the at least one parameter and portions of the configuration settings of the device. The user interface unit further includes a plurality of indicators selectively adapted to identify portions of the configuration settings of the device. In another aspect, the at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor.

In a further aspect, each of the fields comprises a plurality of segments, each segment adapted for displaying numerals from 0 to 9, at least some letters or portions thereof, and a decimal point. The segments may include liquid crystal display (LCD) segments or light emitting diode (LED) segments. The user interface unit further includes a plurality of indicators adapted to identify a numerical or relative value of the at least one parameter, wherein the indicators include light emitting diode (LED) indicators. The serial data interface includes a RS-485 interface or Serial Peripheral Interface (SPI).

According to yet another aspect of the present disclosure, an intelligent electronic device, is provided including a metering module adapted for measuring or calculating at least one parameter of an AC electrical service, the metering module disposed on a first printed circuit board (PCB); a processing module adapted for administering operation of the device and processing data obtained using the metering module; a communication module adapted for coupling to a remote terminal; and a user interface unit adapted for displaying a pre-determined portion of results of measuring or calculating the at least one parameter or configuration settings of the device, wherein (i) a first portion of the communication module is disposed on a second PCB, and (ii) the processing module, the user interface unit, and a second portion of the communication module are disposed on a third PCB having a first surface and a second surface opposing the first surface. The user interface unit is disposed on the first surface of the third PCB and the processing module is disposed on the second surface of the third PCB. The first portion of the communication module comprises an infra-red (IR) communication device, wherein a transmitter/receiver of the IR communication device is disposed on the first surface of the third PCB and the second portion of the communication module comprises a network communication card coupled to the processing module via a connector disposed in the second surface of the third PCB. The network communication card supports at least one of a RS-485 communication protocol, Modbus protocol or a DNP 3.0 communication protocol and provides a KYZ energy pulse output.

In another aspect of the present disclosure, the second portion of the communication module further includes at least one input/output (I/O) card coupled to the processing module via a connector disposed in the second surface of the third PCB. The at least one I/O card is selectively adapted for supporting bi-directional data exchanges using analog 0-1 mA signals, analog 4-20 mA current loop signals, digital signals, relay contacts, solid-state contacts, fiber-optic signals, a 10/100 BaseT Ethernet communication protocol, or a Modbus/TCP communication protocol.

The user interface unit comprises a display, a plurality of indicators, and a plurality of user controls, wherein the display comprises a plurality of fields, each field adapted for selectively displaying a numerical value of the at least one parameter or an alpha-numeric configuration setting of the device. Each of the fields comprises a plurality of segments, each segment adapted for displaying numerals from 0 to 9, at least some letters or portions thereof, and a decimal point. Each of the fields includes four said segments. The segments are liquid crystal display (LCD) segments or light emitting diode (LED) segments. The indicators are adapted for selectively identifying the at least one parameter, wherein a portion of indicators is arranged to indicate a numerical or relative value of the at least one parameter. The user controls includes multi-functional pushbuttons selectively adapted for activating functions of the device or entering user commands.

An intelligent electronic device is provided which includes a metering module adapted for measuring or calculating at least one parameter of an AC electrical service; and a processing module adapted for administering operation of the device and processing data obtained using the metering module, wherein the processing module is adapted for (i) configuring pre-determined settings for the at least one parameter and (ii) detecting events when a numerical value of the at least one parameter becomes equal to or exceeds the pre-determined settings, wherein the pre-determined settings comprise minimal acceptable values or maximum acceptable values of the at least one parameter. The at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor. The device further includes a communication module adapted for transmitting to a remote terminal records relating to the pre-determined settings and timing of the detected events, wherein the communication module is adapted for transmitting the records using at least one of RS-485, DNP 3.0, 10/100 BaseT Ethernet, or Modbus/TCP communication protocols. The communication module is further adapted for reporting the detected events in forms of a change of: a state of at least one relay contact or solid-state contact, a digital state of at least one output terminal, or a numerical value of an analog signal.

In a further aspect of the present disclosure, a method of monitoring a parameter of an AC electrical service is provided including configuring at least one pre-determined setting for the parameter; and detecting events when a numerical value of the parameter becomes equal to or exceeds the at least one pre-determined setting, wherein the at least one pre-determined setting is a minimal acceptable value or a maximum acceptable value of the parameter. The at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor.

In another aspect, the method further includes transmitting records relating to the at least one pre-determined setting and timing of the detected events using a series communication protocol. In another aspect, the method further includes reporting the detected events in forms of a change of: a state of at least one relay contact or solid-state contact, a digital state of at least one output terminal, or a numerical value of an analog signal.

In still a further aspect of the present disclosure, an intelligent electronic device is provided including a metering module adapted for measuring or calculating at least one parameter of an AC electrical service; a processing module adapted for administering operation of the device and processing data obtained using the metering module; and a communication module adapted for coupling to a remote terminal, wherein (i) the processing module is adapted for presenting a data point of the at least one parameter as a datagram having a plurality of data segments, and (ii) the communication module is adapted for transmitting the datagrams, wherein the datagram has a pre-determined number of the data segments; and a content of each data segment of the datagram has a pre-calculated numerical value. An average numerical value of contents of the data segments of the datagram is a pre-determined numerical value. The pre-determined numerical value is equal to an instantaneous numerical value of the at least one parameter. The instantaneous numerical value of the at least one parameter is a fractional numerical value defined with accuracy exceeding binary resolution of the communication module or the remote terminal. The at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor. The communication module is adapted for transmitting the datagrams using a serial communication protocol, wherein the serial communication protocol is at least one of RS-485, DNP 3.0, 10/100 BaseT Ethernet, or Modbus/TCP communication protocols.

In yet aspect, a method of presenting a fractional numerical value in a digital data format, includes forming a datagram having a pre-determined number of the data segments; and assigning to contents of the data segments numerical values providing that an average numerical value of the contents is equal to the fractional numerical value, wherein the fractional numerical value is an instantaneous numerical value of at least one parameter of an AC electrical service selected from the group consisting of a line voltage, a line current, a phase voltage, a phase current, and a total harmonic distortion (THD) or a root mean square (RMS) value thereof; energy, revenue, real power, reactive power, total power, and a power factor. A computer readable medium storing a program code that, when executed by a computer, facilitates execution of the method or portions thereof is also provided.

According to another aspect, an intelligent electronic device includes a metering module adapted for measuring or calculating at least one parameter of an AC electrical service; a processing module adapted for administering operation of the device and processing data obtained using the metering module; and a communication module adapted for coupling to a remote terminal, wherein the communication module includes at least one communication card coupled to the processing module using one or more serial data interfaces, wherein the at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor. The serial data interfaces include at least one of a RS-485 interface or a Serial Peripheral Interface (SPI). The at least one communication card includes a network communication card adapted for transmitting results of measuring or calculating the at least one parameter and transmitting or receiving configuration settings of the device, wherein the network communication card is adapted for supporting data exchanges using a RS-485 interface or a DNP 3.0 interface and for transmitting KYZ energy pulses. The at least one communication card includes an input/output (I/O) card, wherein the I/O card is selectively adapted for supporting data exchanges using a 10/100 BaseT Ethernet interface, a Modbus/TCP interface, analog 0-1 mA signals, analog 4-20 mA current loop signals, digital signals, relay contacts, solid-state contacts, or fiber-optic signals. The communication module further includes an infra-red (IR) communication device.

A method of communicating data using an intelligent electronic device adapted for monitoring an AC electrical service is provided. The method includes measuring or calculating at least one parameter of the AC electrical service; and forwarding results of measuring or calculating the at least one parameter to a transmitter adapted for supporting data exchanges using a RS-485 interface, a DNP 3.0 interface, a 10/100 BaseT Ethernet interface, a Modbus/TCP interface, analog 0-1 mA signals, analog 4-20 mA current loop signals, digital signals, relay contacts, solid-state contacts, or fiber-optic signals, wherein the at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor.

In a further aspect, an intelligent electronic device includes a metering module adapted for measuring or calculating at least one parameter of an AC electrical service; a processing module adapted for administering operation of the device and processing data obtained using the metering module; and a display adapted for displaying numerical values of the at least one parameter, wherein the processing module is adapted for: calculating an average value $F_1$ of M consecutive data points $DP_1$ through $DP_M$ of the at least one parameter, $F_1=(DP_1+DP_2+\ldots+DP_M)/M$, where M is a pre-determined integer and M>1; calculating a weighted average $F_2$ of M+1 consecutive data points $DP_1$ through $DP_{M+1}$ of the at least one parameter, $F_2=[(M-1)F_1+DP_{M+1}]/M$; if $|F_2-DP_{M+1}|$ is equal to or smaller than a pre-determined constant, displaying on the display the weighted average $F_2$; and if $|F_2-DP_{M+1}|$ is greater than the pre-determined constant, displaying on the display the data point $DP_{M+1}$ and replacing the average value $F_1$ with $DP_{M+1}$. The at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor. A periodicity of calculating the weighted average $F_2$ is substantially greater than a rate of refreshing the display.

In another aspect, a method of displaying on a display a numerical value of a time-varying parameter includes calculating an average value $F_1$ of M consecutive data points $DP_1$ through $DP_M$ of the parameter, $F_1=(DP_1+DP_2+\ldots+DP_M)/M$, where M is a pre-determined integer and M>1; calculating a weighted average $F_2$ of M+1 consecutive data points $DP_1$ through $DP_{M+1}$ of the parameter, $F_2=[(M-1)F_1+DP_{M+1}]/M$; if $|F_2-DP_{M+1}|$ is equal to or smaller than a pre-determined constant, displaying on the display the weighted average $F_2$; and if $|F_2-DP_{M+1}|$ is greater than the pre-determined constant, displaying on the display the data point $DP_{M+1}$ and replacing the average value $F_1$ with $DP_{M+1}$, wherein the numerical value of the time-varying parameter comprises a noise component. The method further includes calculating the weighted average $F_2$ with a periodicity that is substantially greater then a rate of refreshing the display. The time-varying parameter is a parameter of an AC electrical service selected from the group consisting of a line voltage, a line current, a phase voltage, a phase current, and a total harmonic distortion (THD) or a root mean square (RMS) value thereof; energy, revenue, real power, reactive power, total power, and a power factor.

In still another aspect, an intelligent electronic device includes a metering module adapted for measuring or calculating at least one parameter of an AC electrical service; and a processing module adapted for administering operation of the device and processing data obtained using the metering module, wherein the processing module is adapted for averaging numerical values of data points of the at least one parameter having same timing relationship in a pre-defined number of consecutive AC cycles. The processing module is further adapted for averaging the numerical values of the data points during a pre-determined time interval. The at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor.

In another aspect, the data points are acquired in the consecutive AC cycles after expiration of same time intervals starting at zero-crossing points of said AC cycles, wherein the zero-crossing points are moments of time when a polarity of the at least one parameter changes from a negative polarity to a positive polarity when a polarity of the at least one parameter changes from a positive polarity to a negative polarity. In one aspect, the pre-defined number of data points is equal to or greater than 4.

According to yet another aspect of the present disclosure, a method of measuring an instant numerical value of a cyclically-varying parameter having a noise component includes (a) selecting data points of the parameter having same timing relationship in a pre-defined number of consecutive cycles of the parameter or during a pre-determined time interval; (b) calculating an average numerical value of the data points; and (c) adopting the average numerical value of the data points as the instant numerical value of the parameter. The data points are acquired in the consecutive cycles after expiration of same time intervals starting at zero-crossing points of said cycles. In one aspect, the pre-defined number of data points is equal to or greater than 4. The cyclically-varying parameter is a parameter of an AC electrical service selected from the group consisting of a line voltage, a line current, a phase voltage, a phase current, and a total harmonic distortion (THD) or a root mean square (RMS) value thereof; energy, revenue, real power, reactive power, total power, and a power factor.

In another aspect, an intelligent electronic device is provided including a metering module adapted for measuring or calculating at least one parameter of an AC electrical service; a processing module adapted for administering operation of the device and processing data obtained using the metering module; a user interface unit adapted for displaying results of measuring or calculating the at least one parameter or configuration settings of the device; and a communication module adapted for coupling to a remote terminal, wherein the device is adapted for: performing calibrating measurements of supply voltages or supply currents of the AC electrical service in a plurality of calibrating points; adjusting gain factors of sensors of the supply voltages or the supply currents; forming first measuring channels time-locked to zero-crossing points of the supply voltages or the supply currents and second measuring channels time-locked to pre-determined moments of time; presenting a data point of the at least one parameter as a datagram having a plurality of data segments which average numerical value is equal to an instantaneous numerical value of the at least one parameter; averaging numerical values of data points of the at least one parameter having same timing relationship in a pre-defined number of consecutive AC cycles or during a pre-determined time interval; displaying a pre-determined portion of results of processing the data; displaying at least a portion of the configuration settings of the device; and exchanging information with the remote terminal. The at least one parameter is selected from the group consisting of a line voltage, a line current, a phase voltage, a phase current, and a total harmonic distortion (THD) or a root mean square (RMS) value thereof; energy, revenue, real power, reactive power, total power, and a power factor.

The metering module includes a sensing circuit adapted for monitoring at least a portion of the supply voltages or the supply currents; a data acquisition system; and a gain control unit adapted for selectively adjusting operating ranges of at least a portion of output signals of the sensing circuit to match pre-determined ranges for input signals of the data acquisition system.

The user interface unit includes a display adapted for displaying alpha-numeric information contained in said instructions; indicators of the configuration settings of the device or a relative numerical value of the at least one parameter; user controls selectively coupled to the processing module and adapted for activating functions of the device or entering user commands; and a decoder of instructions received, via a serial data interface, from the processing module.

In another aspect, the communication module includes a network communication card coupled to the processing module using one or more serial data interfaces and adapted for exchanging data using a RS-485 interface or a DNP 3.0 interface and transmitting KYZ energy pulses. The communication module further includes at least one input/output (I/O) card coupled to the processing module using one or more serial data interfaces and selectively adapted for exchanging data using a 10/100 BaseT Ethernet interface, a Modbus/TCP interface, analog 0-1 mA signals, analog 4-20 mA current loop signals, digital signals, relay contacts, solid-state contacts, or fiber-optic signals.

A method of monitoring a parameter of an AC electrical service using an intelligent electronic device is provided including performing calibrating measurements of supply voltages or supply currents of the AC electrical service in a plurality of calibrating points; adjusting gain factors of sensors of the supply voltages or the supply currents; forming first measuring channels time-locked to zero-crossing points of the supply voltages or the supply currents and second measuring channels time-locked to pre-determined moments of time; presenting a data point of the parameter as a datagram having a plurality of data segments which average numerical value is equal to an instantaneous numerical value of the parameter; averaging numerical values of data points of the parameter having same timing relationship in a pre-defined number of consecutive AC cycles or during a pre-determined time interval; displaying a pre-determined portion of results of measuring or calculating a numerical value of the parameter; displaying at least a portion of the configuration settings of the device; and exchanging information with the remote terminal, wherein the parameter is selected from the group consisting of a line voltage, a line current, a phase voltage, a phase current, and a total harmonic distortion (THD) or a root mean square (RMS) value thereof; energy, revenue, real power, reactive power, total power, and a power factor.

Various aspects and embodiments of the disclosure are described in further detail below.

The Summary is neither intended nor should it be construed as being representative of the full extent and scope of the present disclosure, which these and additional aspects will become more readily apparent from the detailed description, particularly when taken together with the appended drawings.

Figure 1:
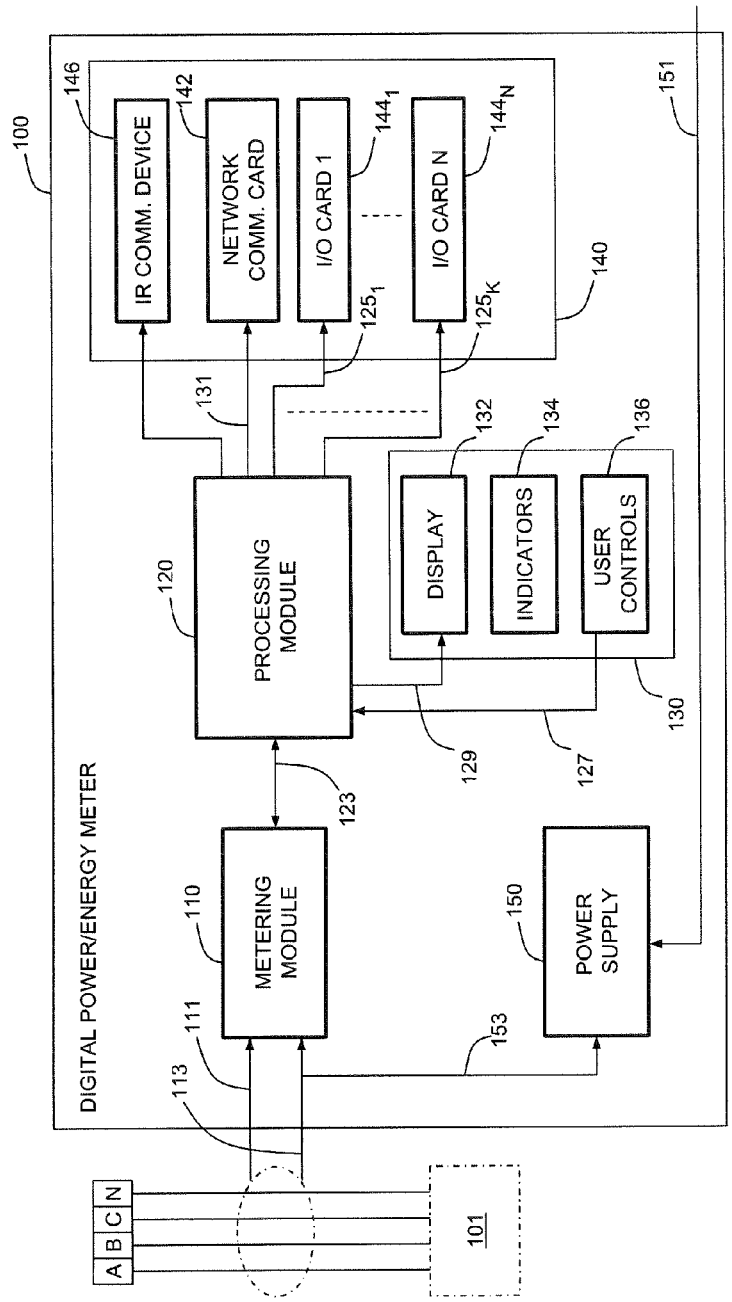
FIG. 1 is a schematic diagram of an exemplary digital electrical power and energy meter in accordance with one embodiment of the present disclosure.

To facilitate understanding, identical reference numerals have been used, where possible, to designate identical elements that are common to the figures, except that suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. It is contemplated that features or steps of one embodiment may beneficially be incorporated in other embodiments without further recitation.

In some embodiments, method steps of methods in FIGS. 13, 14, 16, 18, 20, 22, 24, 26, 29, and 31 are performed in the depicted order. In alternate embodiments, in the respective methods, at least two method steps or portions thereof may be performed contemporaneously, in parallel, or in a different order.

DETAILED DESCRIPTION

Aspects of the present disclosure are illustratively described herein within the context of digital electrical power and energy meters, including revenue accuracy certifiable meters. The term "digital electrical power and energy meters" is broadly used herein in reference to IEDs adapted to record, measure, or communicate at least some of supply currents and supply voltages of the respective electrical service, their waveforms, harmonics, transients, and other disturbances, and the corresponding parameters, such as power, power quality, energy, revenue, and the like. Moreover, a variety of electrical service environments may employ IEDs and, in particular, may employ digital electrical power and energy meters. By way of example and not limitation, these environments include power generation facilities (e.g., hydroelectric plants, nuclear power plants, etc.), power distribution networks and facilities, industrial process environments (e.g., factories, refineries, etc.), and backup generation facilities (e.g., backup generators for a hospital, a factory, etc.).

It will be appreciated by those skilled in the art that the disclosure may also be utilized within the context of other IEDs, including Programmable Logic Controllers ("PLC's"), Remote Terminal Units ("RTUs"), protective relays, or fault recorders, among other devices or systems used to manage and control quality, distribution, and consumption of electrical power.

FIG. 1 depicts a schematic diagram illustrating an exemplary digital electrical power and energy meter 100 (referred to hereafter as "meter") in accordance with one embodiment of the present disclosure. The meter 100 generally comprises a metering module 110, a processing module 120, an optional user interface unit 130, a communications module 140, and a power supply 150.

The metering module 110 is coupled to supply lines of electrical service 101 (shown in phantom) using current interface 111 and voltage interface 113. In the depicted embodiment, the supply lines illustratively include phase lines A, B, and C and a neutral line N. Methods of coupling digital electrical power and energy meters to various electrical services are described in detail in U.S. patent application Ser. No. 11/003,064, the contents of which are hereby incorporated by reference. As used herein, the term "coupled" is defined to mean directly connected to or indirectly connected to through one or more intermediate components. Such intermediate components may include both hardware and software based components.

Figure 2:
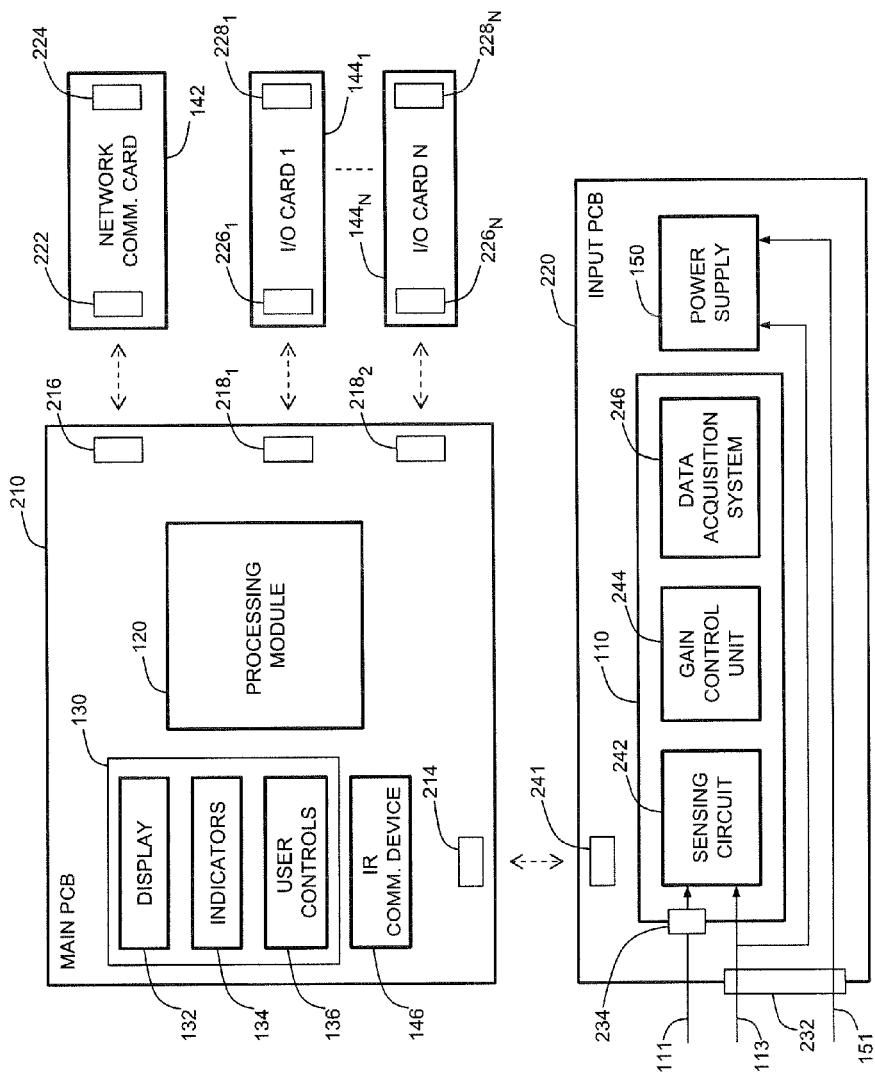
FIG. 2 is a schematic diagram illustrating circuit configuration of the meter of FIG. 1.
Figure 17:
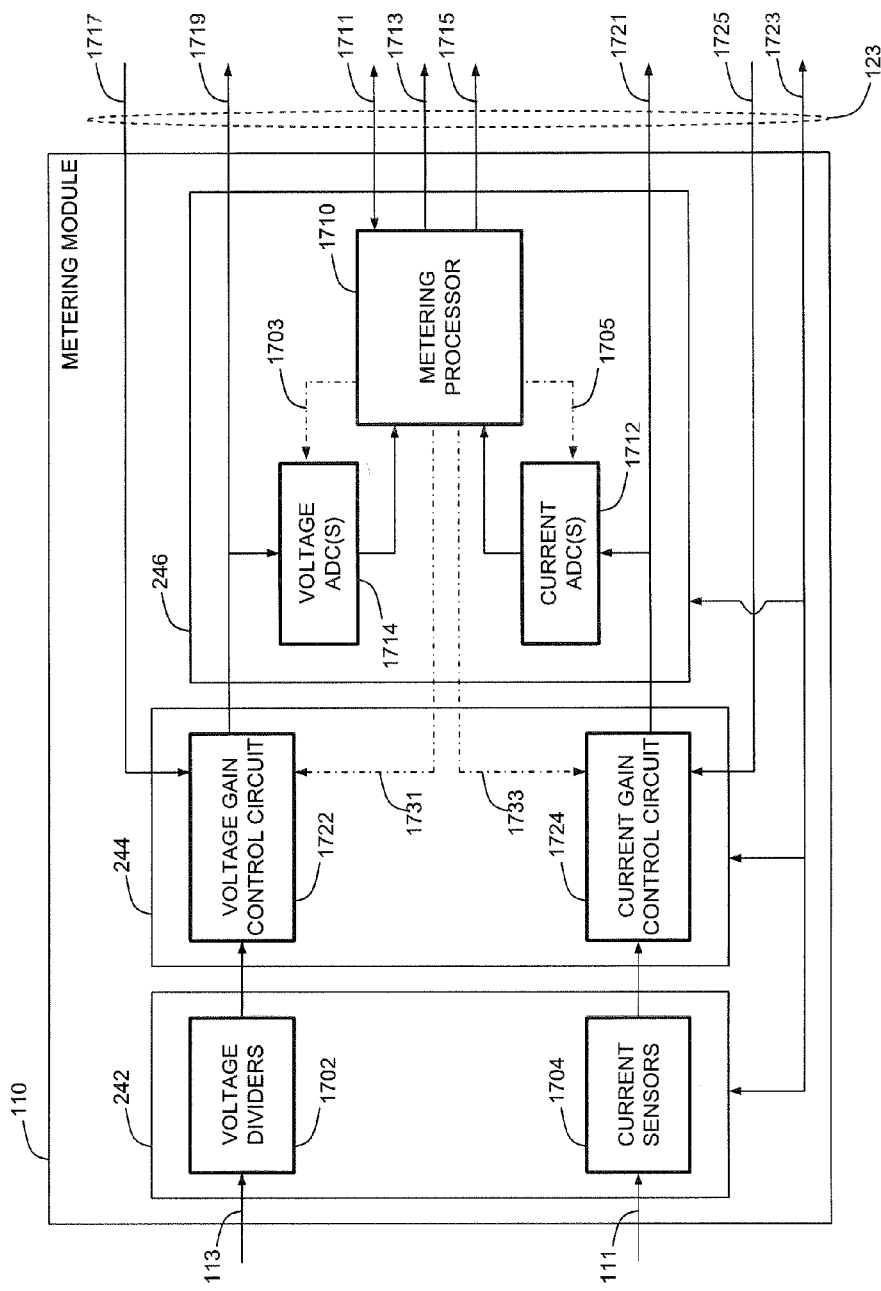
FIG. 17 is a schematic diagram illustrating circuit configuration of a metering module of the meter of FIG. 1.

Referring to FIG. 2 and FIG. 17, in one embodiment, the metering module 110 comprises a sensing circuit 242 including voltage dividers 1702 (or potential transformers) and current sensors 1704, a gain control unit 244 including voltage and current gain control circuits 1722 and 1724, and a data acquisition system 246 including current analog-to-digital converters (ADCs) 1712, voltage ADCs 1714, and a metering processor 1710. Components of the metering module 110 are adapted to process signals corresponding to the supply voltages and currents of the phase lines A, B, and C of the electrical service 101, which are provided to the sensing circuit 242 via interfaces 113 and 111, respectively.

Using interface 123, the metering module 110 is coupled to the processing module 120. In one embodiment, the interface 123 includes Serial Peripheral Interface (SPI) 1711, control interface 1723, voltage and current gain control buses 1717 and 1725, gain-adjusted outputs 1719 and 1721 of the circuits 1722 and 1724, an energy test pulse (i.e., KYZ pulse) output 1713, and a bus 1715 providing zero-crossing signals of the metering processor 1710.

Figure 3:
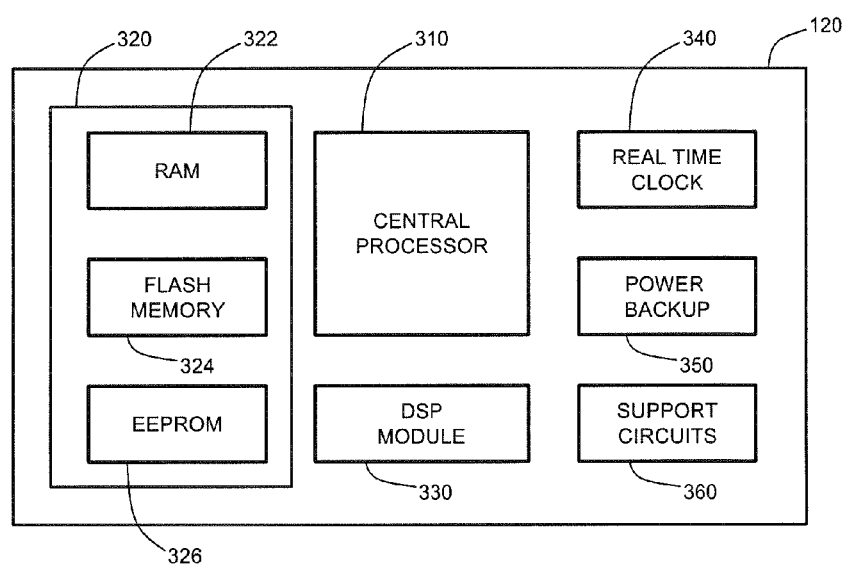
FIG. 3 is a block diagram of a processing module of the meter of FIG. 1.

Referring to FIG. 3, in one embodiment, the processing module 120 comprises a central processor 310, a digital signal processing (DSP) module 330, a real-time clock 340, a power backup 350 (e.g., replaceable battery), support circuits 360, and a memory module 320 including a random access memory (RAM) 322, a flash memory 324, and an electrically erasable programmable read-only memory (EEPROM) 326. It is to be appreciated that the components of the processing module 120 may be disposed on a single integrated circuit or arranged over several integrated circuits on a printed circuit board.

Figure 4:
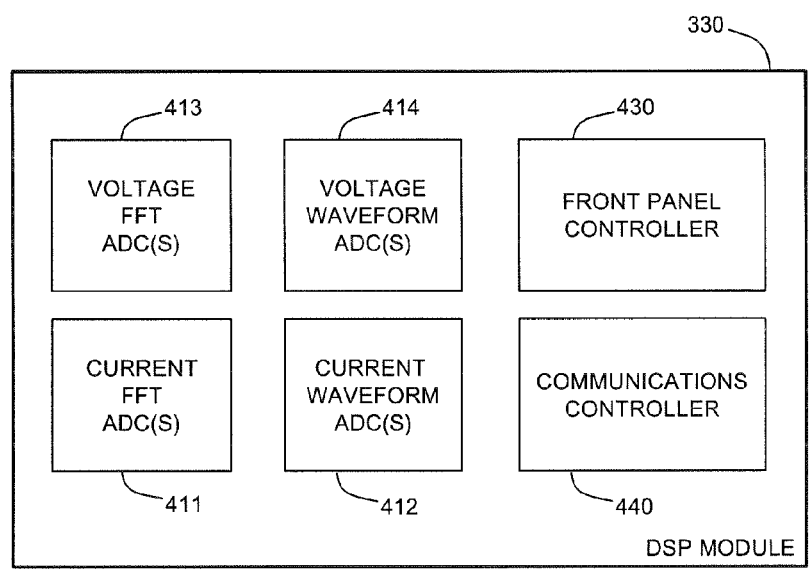
FIG. 4 is a block diagram of a DSP module of the meter of FIG. 1.

Referring to FIG. 4, the DSP module 330 includes analog to digital converters ADCs 411-414 converting in a digital domain analog output signals 1719 and 1721 (shown in FIG. 17) of the metering module 110, a front panel controller 430 (discussed in reference to FIG. 28), and a communications controller 440.

In one embodiment, the ADCs 411-414 (typically, each such ADC includes a dedicated unit for each one of the phases A, B, and C) are used in Fast Fourier Transform (FFT) analysis (ADCs 411, 413) and waveform analyses (ADCs 412, 414) of the voltages (ADCs 413, 414) and currents (ADCs 411, 412) of the electrical service 101. The waveform capture and analysis of analog output voltage and current signals 1719 and 1721 will be describe below in relation to FIG. 32.

In operation, the front panel controller 430 administers data exchanges between the processing module 120 and user interface unit 130, and the communications controller 440 administers data exchanges between the processing module 120 and communications module 140, respectively.

Figure 12:
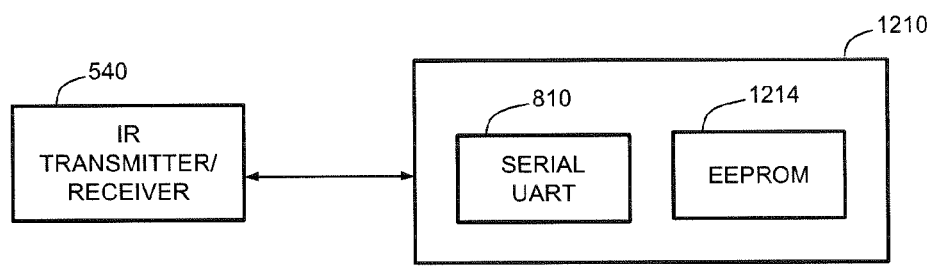
FIG. 12 is block diagram an IR communication device of the meter of FIG. 1.

Referring back to FIG. 1, in one embodiment, the user interface unit 130 comprises a front panel display 132, a plurality of indicators 134 (for example, LED indicators), user controls 136, and an IR transmitter/receiver 540 (discussed in reference to FIG. 12.

Figure 5:
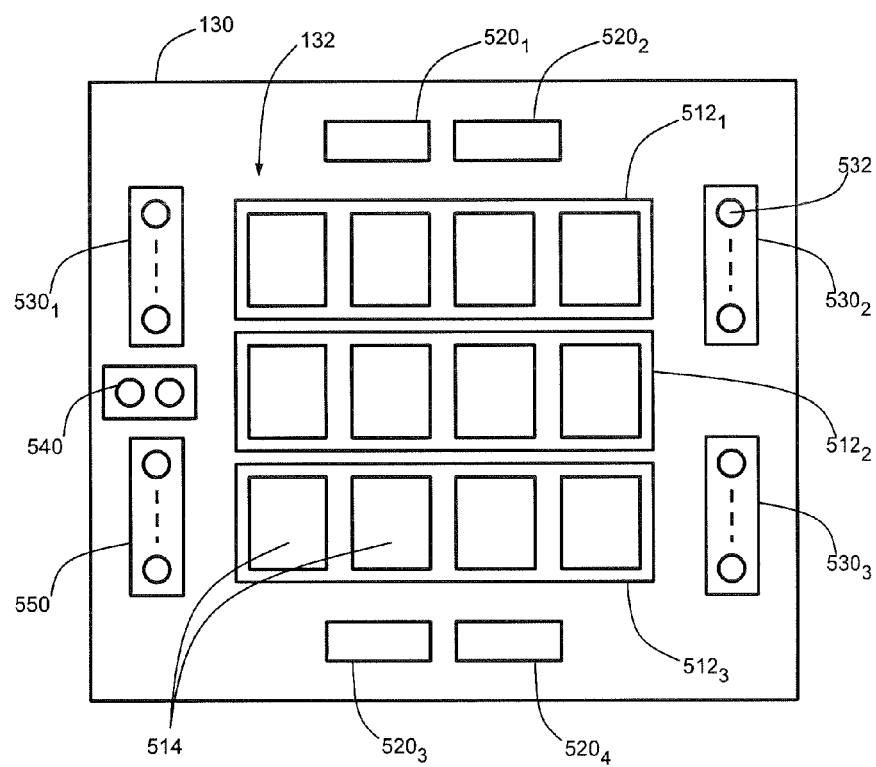
FIG. 5 is a schematic view of a front panel of the meter of FIG. 1.

Referring to FIG. 5, in one embodiment, the front panel display 132 includes a plurality of segments 514 (for example, liquid crystal display (LCD) segments, LED segments, etc.). Each segment 514 is adapted for displaying numerals from 0 to 9, at least some letters or recognizable portions thereof, and a decimal point. The segments 514 are arranged in 3 rows $512_1$-$512_3$, each row including 4 segments 514.

In the depicted embodiment, the indicators 134 are arranged as groups $530_1$-$530_3$ and a status bar 550. The groups $530_1$-$530_3$ are composed of LEDs 532, where each LED identifies a particular kind of data presented on the front panel display 132. Correspondingly, the status bar 550 includes a plurality of LEDs arranged to indicate a numerical or relative value of a pre-selected parameter that is monitored or calculated by the meter 100.

The user controls 136 generally include multi-functional pushbuttons $520_1$-$520_4$ allowing to select particular data of interest for being shown on the front panel display 132, confirm configuration settings of the meter 100, or review status messages generated by the meter.

In one exemplary embodiment, the LED indicators 532 correspond to the following properties: "VOLTS L-N", "VOLTS L-L", "Amps", "W/VAR/PF", "Wh", "VARh" (block $530_1$); "MAX", "MIN", "LM1", LM2", % THD", "PRG" (block $530_2$); and "Wh Pulse", "KILO", "MEGA" (block $530_3$), where abbreviations "L-N", "L-L", "PF", "LM", "THD", and PRG" refer to the terms "line-to-neutral", "line-to-line", power factor", "limit", "total harmonic distortion", and "programming mode", respectively. In this embodiment, the status bar 550 shows an amount, in percents, of consumed electrical power versus a pre-determined limit, and the "MENU", "ENTER", "▼" (i.e., "Scroll Down"), and "▶" (i.e., "Select") pushbuttons 520 are selectively used to activate functions or configuration settings of the meter 100.

In other embodiments, the meter 100 may comprise the display 132 having a different configuration (e.g., different number of segments 514), as well as the LED indicators 532 may correspond to different parameters or properties. In other embodiments, the display 132, indicators 134 and user controls 136 may be configured as a single touch screen.

Referring back to FIG. 1, in one embodiment, the communications module 140 comprises a network communication card 142, a plurality of optional input/output (I/O) cards $144_1$-$144_N$, where N is an integer, and an infra-red (IR) communication device 146. Each meter 100 may be configured to include up to two of the same or different I/O cards 144.

The power supply 150 provides power to components of the meter 100 and typically is coupled, via interface 151, to an external power source (not shown) or, alternatively or additionally, to the voltage interface 113 (shown with interface 153).

Referring to back FIG. 2, in one embodiment, the meter 100 includes a main printed circuit board (PCB) 210, an input PCB 220, the network communication card 142, e.g., a RS-485 card, and, optionally, one or two I/O cards 144.

The main PCB 210 generally contains the processing module 120, the user interface unit 130, and the IR communication device 146. Accordingly, the input PCB 220 generally contains the metering module 110 and the power supply 150.

The input PCB 220, network communication card 142, and I/O cards 144 are coupled to connectors 214, 216, and $218_1$-$218_2$ of the main PCB 210 using the mating input connectors (for example, plug-in connectors) 241, 222, and $226_1$-$226_N$, respectively. In particular, any of the I/O cards 144 may be coupled to the connector $218_1$ or the connector $218_2$.

The input PCB 220 is provided with a connector 232 for coupling to the voltage interface 113 and interface 151 and includes a means 234 for coupling to the current interface 111.

Correspondingly, the network communication card 140 and I/O cards $144_1$-$144_N$ include output connectors 224 and $228_1$-$228_N$, respectively, to provide connectivity between the meter 100 and external circuits (not shown).

Figure 6:
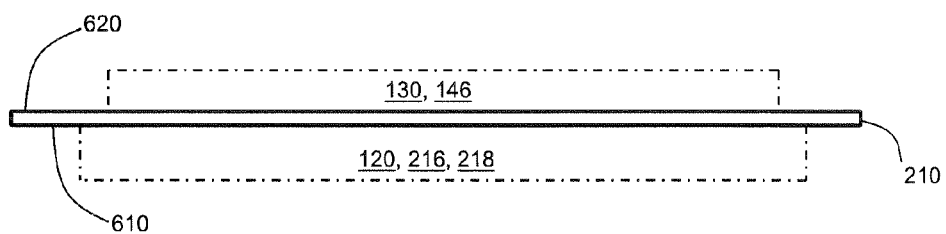
FIG. 6 is a schematic diagram of a main assembly of the meter of FIG. 1.

Referring to FIG. 6, in one embodiment, the processing module 120 and connectors 241, 216, and $218_1$-$218_2$ are disposed on one surface of the main PCB 210 (illustratively, on surface 610), while the user interface unit 130 and the IR communication device 146 are disposed on opposing surface 620 of the PCB (all components are shown in phantom). Alternatively, portions of the processing module 120 or the IR communication device 146 may be disposed on the opposite surfaces of the main PCB 210.

Figure 7:
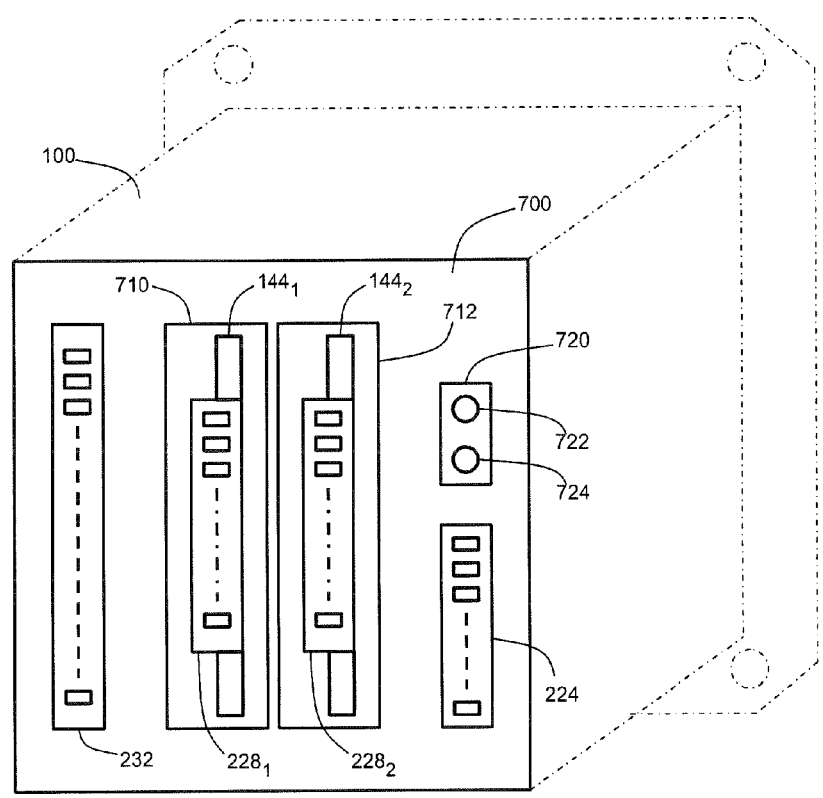
FIG. 7 is a schematic view of a back panel of the meter of FIG. 1.

Referring to FIG. 7, in one embodiment, a rear panel 700 of the meter 100 (shown in phantom) includes the connectors 232 and 224, openings 710, 712 for the I/O cards 144 (illustratively, cards $144_1$ and $144_2$ are shown), and a status display 720. Vacant openings for the I/O cards 144 may be sealed using protective covers (not shown). The status display 720 generally includes LEDs 722 and 724 indicating a current direction of data transmission (i.e., incoming (RX) or outgoing (TX) data transmission) via the network communication card 142.

Exemplary I/O cards 144 include a 10/100 BaseT Ethernet I/O card $144_1$, analog I/O cards $144_2$ and $144_3$, relay I/O cards $144_4$ and $144_5$, and a fiber-optic I/O card $144_6$. In one embodiment, the I/O cards 144 are coupled to the processing module 120 using one or more serial interfaces, for example, SPI interface.

Figure 8:
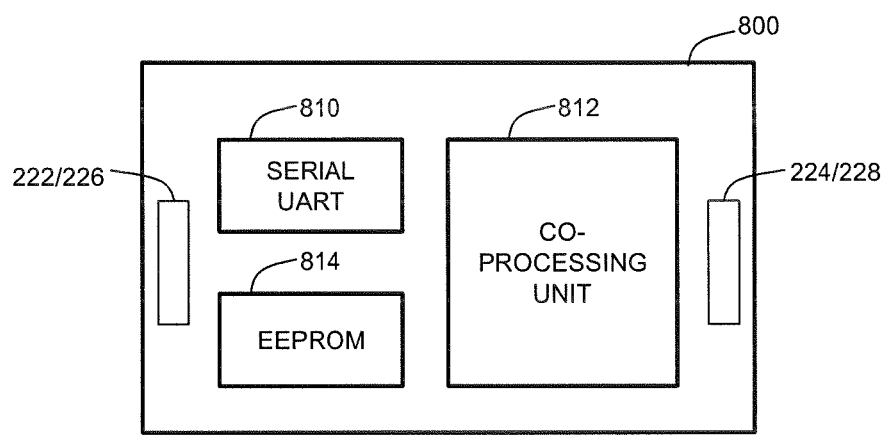
FIG. 8 is a block diagram of a network I/O card of the meter of FIG. 1.

Referring to FIG. 8, each of the network communication card 142 or the 10/100 BaseT Ethernet I/O card $144_1$ (collectively denoted using a numeral 800) generally includes a serial Universal Asynchronous Receiver/Transmitter (UART) 810, a co-processing unit 812, and an EEPROM 814. In one embodiment, the network communication card 142 supports RS-485, Modbus and DNP 3.0 communication protocols, or interfaces, and whereas the 10/100 BaseT Ethernet I/O card $144_1$ supports the 10/100 BaseT Ethernet and Modbus/TCP communication protocols.

Figure 9:
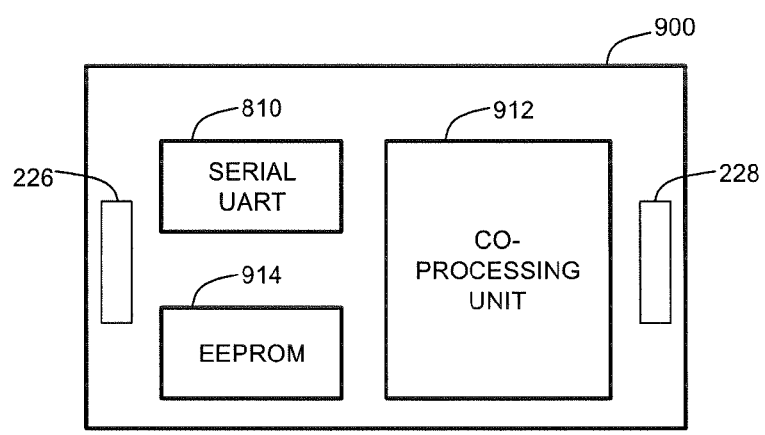
FIG. 9 is a block diagram of an analog output I/O card of the meter of FIG. 1.

Referring to FIG. 9, each of the analog I/O cards $144_2$ and $144_3$ (collectively denoted using a numeral 900) generally includes the UART 810, a co-processing module 912, and an EEPROM 914. In one embodiment, the I/O card $144_2$ supports standard bi-directional 0-1 mA signals, and the I/O card $144_2$ supports standard 4-20 mA current loop signals.

Figure 10:
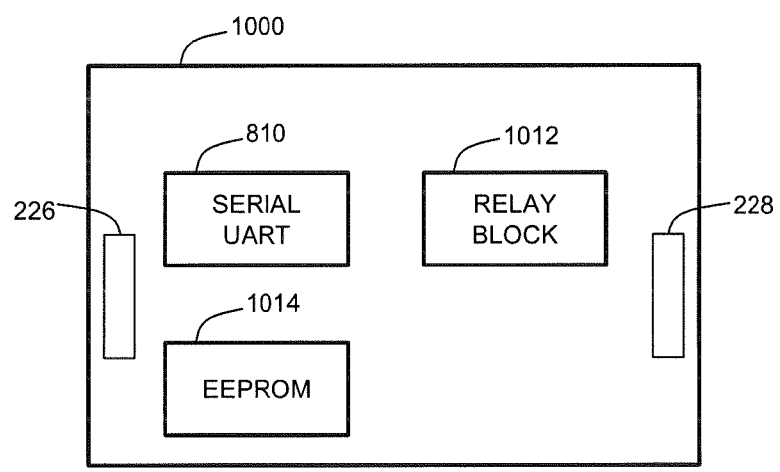
FIG. 10 is block diagram of a relay/KYZ pulse output I/O card of the meter of FIG. 1.

Referring to FIG. 10, each of the relay I/O cards $144_4$ and $144_5$ (collectively denoted using a numeral 1000) generally includes the UART 810, a relay block 1012, and an EEPROM 1014. In one embodiment, the relay I/O cards $144_4$ and $144_5$ provide digital inputs and a plurality of output ON/OFF contacts (card $144_3$) and a plurality solid-state output contacts (card $144_4$).

Figure 11:
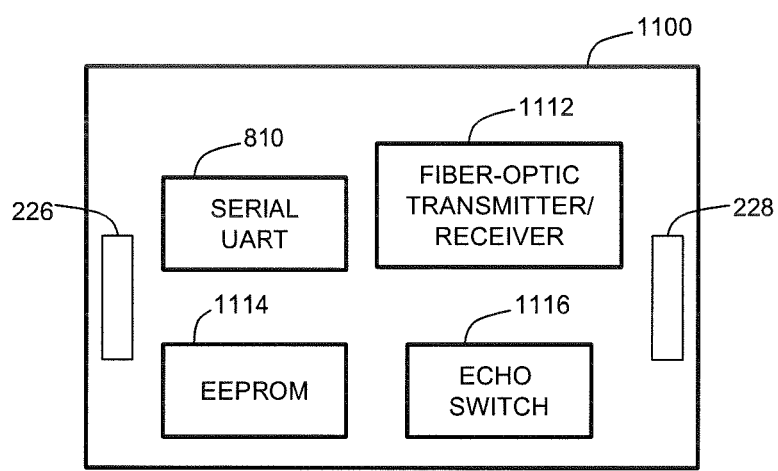
FIG. 11 is a block diagram of a fiber-optic I/O card of the meter of FIG. 1.

Referring to FIG. 11, the fiber-optic I/O card $144_6$ (collectively denoted using a numeral 1100) generally includes the UART 810, a fiber-optic receiver/transmitter 1112, an EEPROM 1114, and an echo switch 1116. In operation, the echo switch 1116 allows incoming messages to bypass the meter 100, thus enabling the meter for use in networks having daisy-chain configurations.

Referring to FIG. 12, the IR communication device 146 generally comprises the IR transmitter/receiver 540 and a controller 1210 including the UART 810 and an EEPROM 1214. In one embodiment, the IR communication device 146 supports a bi-directional IR communication link with an external IR-enabled communication device (not shown), such as a Personal Digital Assistant (PDA), and the like.

Hereafter, the terms $V_S$ and $I_S$ are collectively used to designate supply voltages and supply currents of the phases A, B, and C of the electrical service 101.

Figure 13:
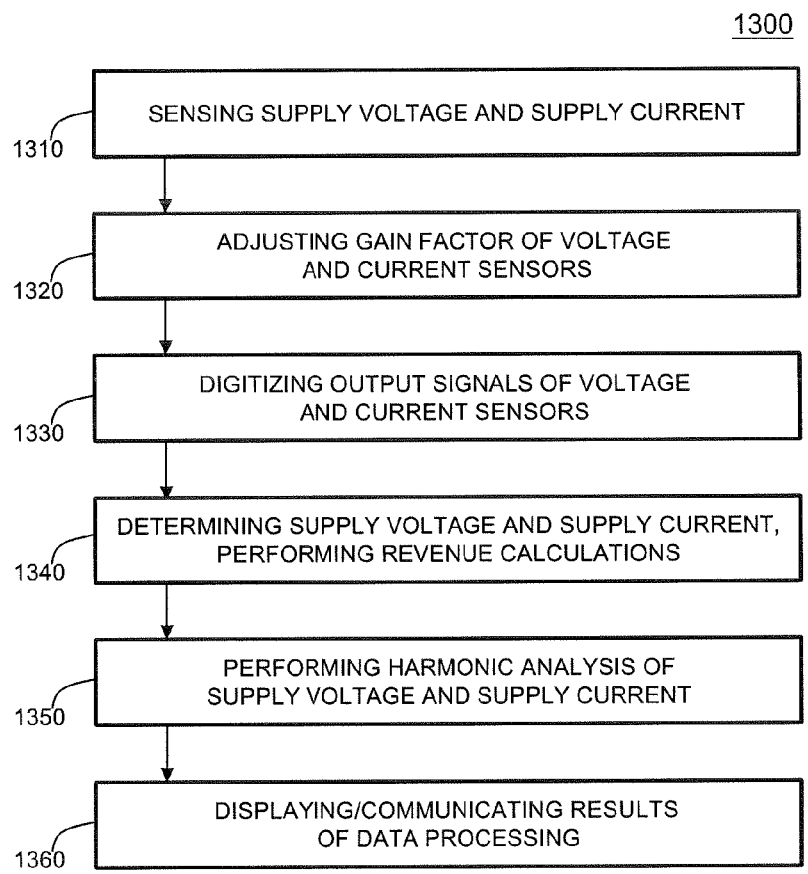
FIG. 13 is a high-level flow chart of a method of operating the meter of FIG. 1.

FIG. 13 depicts a high-level flow diagram of a method 1300 of operating the meter 100 of FIG. 1 in accordance with one embodiment of the present disclosure. To best understand the disclosure, the reader should to refer to FIG. 13 and FIGS. 1, 17 simultaneously.

At step 1310, the supply voltages $V_S$ and supply currents $I_S$ are sensed using the respective voltage dividers 1702 and currents sensors 1704 of the sensing circuit 242 (shown in FIG. 17) of the metering module 110.

Figure 16:
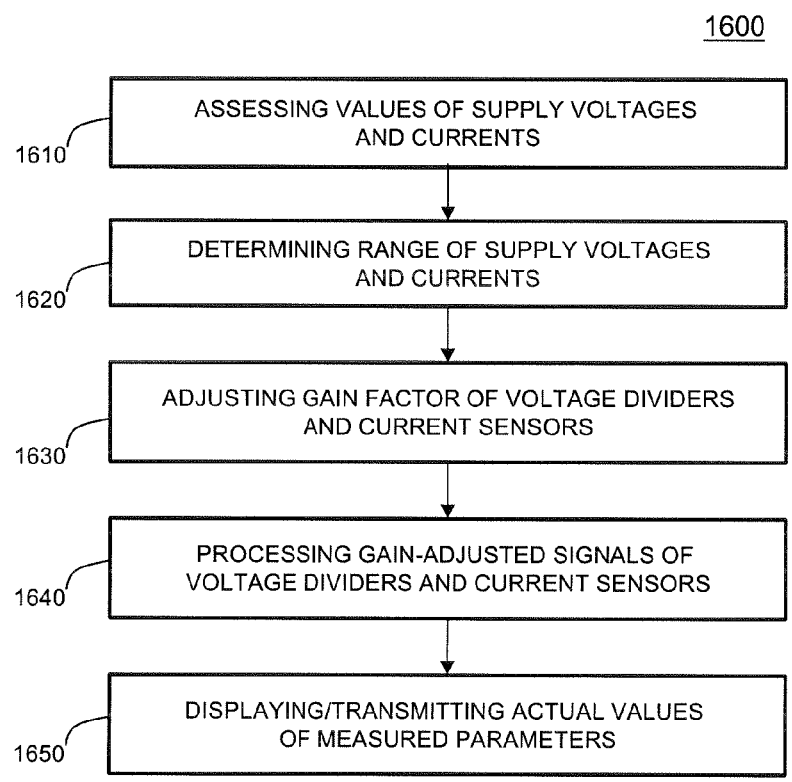
FIG. 16 is a high-level flow chart of a method for ranging supply voltages and supply currents in the meter of FIG. 1.

At step 1320, gain factors of the voltage dividers 1702 and currents sensors 1704 are adjusted to pre-determined ranges using the voltage and current gain control circuits 1722 and 1724, respectively, of the gain control unit 244 of the metering module 110 (discussed in reference to FIG. 16).

At step 1330, output signals of the voltage dividers 1702 and currents sensors 1704 are digitized in the metering module 110 and, using ADCs 411-414, in the DSP module 330 of the processing module 120.

At step 1340, the meter 100 determines the supply voltages $V_S$ and supply currents $I_S$ and performs energy/revenue calculations. In one embodiment, these measurements are performed using a frequency-locked measuring scheme (discussed in reference to FIG. 19 and FIG. 23).

At step 1350, the meter 100 performs harmonic analysis of waveforms of the supply voltages $V_S$ and supply currents $I_S$. In one embodiment, the harmonic analysis is performed using a time-locked measuring scheme (discussed in reference to FIG. 23).

At step 1360, the results of steps 1340 and 1350 are selectively displayed on the front panel display 132 and/or, using the communications module 140, forwarded to the respective addressee of the meter 100.

Figure 14:
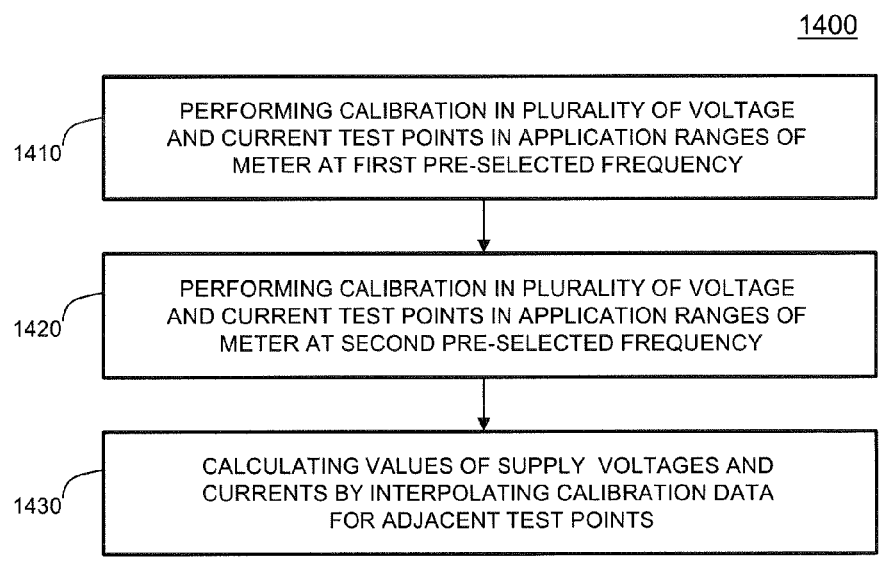
FIG. 14 is a high-level flow chart of a method for performing voltage, current, and frequency calibrations in the meter of FIG. 1.
Figure 15:
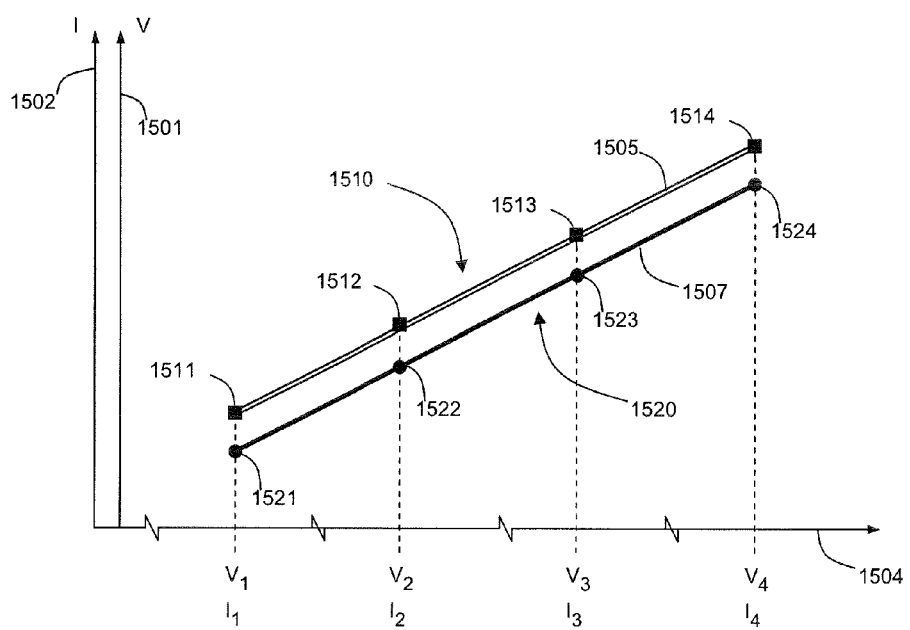
FIG. 15 is a series of exemplary graphs illustrating the method of FIG. 14.

FIG. 14 depicts a high-level flow chart of a method 1400 for performing voltage, current, and frequency calibrations in the meter 100 of FIG. 1 in accordance with one embodiment of the present disclosure, and FIG. 15 depicts exemplary graphs 1510 and 1520 illustrating the method 1400. To best understand the disclosure, the reader should to refer to FIGS. 14-15 simultaneously.

Referring to FIG. 15, the graphs 1510 and 1520 depict calibration traces 1505 and 1507 for voltage V and current I (y-axes 1501 and 1502, respectively) as functions of a reference voltage $V_R$ and a reference current $I_R$ (aggregated x-axis 1504). The traces 1505 and 1507 are selectively accumulated at first and second pre-determined AC frequencies $F_1$ and $F_2$, respectively.

At step 1410, gain factors of components of the meter 100 and, in particular, the measuring module 110, are calibrated at a plurality of pre-determined test points (i.e., reference voltages $V_R$ and currents $I_R$), which are disposed in the respective application ranges of the meter 100 (illustratively, voltage test points 1511-1514 (graph 1510) and current test points 1521-1524 (graph 1520) are shown).

In one exemplary embodiment, the test points correspond to the reference voltages $V_1$=69V, $V_2$=120V, $V_3$=220V, and $V_4$=480V and reference currents $A_1$=250 mA, $A_2$=500 mA, $A_3$=1 A, and $A_4$=5 A at the first pre-determined AC frequency $F_1$=50 Hz. Accuracy of calibrations may be about 0.2% or greater. Generally, certified sources of reference voltages and currents are used to perform such calibrations.

At step 1420, the same calibration routine is repeated at the second pre-determined AC frequency $F_2$=60 Hz.

At step 1430, in operation, during measurements of the voltages $V_S$ or currents $I_S$, their respective values are defined by linearly interpolating calibration data for numerically adjacent test points as measured at the AC frequencies $F_1$ and $F_2$. For example, a value of a particular supply voltage $V_X$, where $V_1 < V_X < V_2$ (or particular supply current $I_X$, where $I_1 < I_X < I_2$) having an AC frequency $F_X$, where $F_1 < F_X < F_2$, is determined using linear interpolation equations for nominal values of the numerically adjacent test points 1511 and 1512 (or 1521 and 1522) that, additionally, are similarly frequency-interpolated.

Using the method 1400, the meter 100 may be calibrated, with pre-determined accuracy, in all operating ranges of the electrical service 101. The results of calibrating the meter 100 may be stored in the EEPROM.

FIG. 16 depicts a high-level flow chart of a method 1600 for ranging supply voltages $V_S$ and supply currents $I_S$ in the meter 100 of FIG. 1 in accordance with one embodiment of the present disclosure, and FIG. 17 is a schematic diagram illustrating the method 1600. To best understand the disclosure, the reader should to refer to FIG. 16-17 simultaneously.

At step 1610, the meter 100 assesses nominal values of the supply voltages $V_S$ and currents $I_S$ measured using the metering module 110. These values may be determined using the processing module 120 or, alternatively, using the metering processor 1710 of the metering module 110.

At step 1620, the meter 100 determines an industry-standard nominal value of the supply voltage $V_S$ (for example, 69V, 120V, 230V, 277V, 347V, 416V, 721V, etc.) and a nominal range for the supply currents $I_S$ (for example, 0-1 A, 0-5 A, or 0-10 A).

At step 1630, gain factors of the voltage dividers 1702 and current sensors 1704 are adjusted using voltage and current gain control circuit 1722 and 1724, respectively. In the depicted embodiment, the circuit 1722 and 1724 are controlled using respective signals of the voltage and current gain control buses 1717 and 1725. In an alternate embodiment (shown in phantom using links 1731 and 1733), the circuit 1722 and 1724 may be controlled using the respective output signals generated by the metering processor 1710.

After such gain adjustments, regardless of actual values of the supply voltages $V_S$ and supply currents $I_S$ of the electrical service 101, output signals of the circuit 1722 correspond to a pre-selected industry-standard range ΔV for the supply voltages $V_S$ (for example, 0-120V), and output signals of the circuit 1724 correspond to a pre-selected range ΔI for the supply currents $I_S$ (for example, 0-2 A).

Gain adjustments for the supply voltages and currents may be performed in a real time (i.e., dynamically) or, alternatively, gain factors of the circuit 1722 or circuit 1724 may be pre-configured based on known characteristics of the electrical service 101 or electrical load, which power consumption is monitored using the meter 100. In operation, procedures of step 1630 allow to perform measurements of the voltages $V_S$ and supply currents $I_S$, regardless of their nominal values, with the same high accuracy in the respective operating ranges of the meter 100.

In some embodiments, the circuit 1722 and 1724 comprise separate gain-controlled amplifiers for each phase of the electrical service 101. Alternatively, each of the circuits 1722 and 1724 may include one such amplifier and multiplexers/demultiplexers of the gain-controlled signals.

At step 1640, the meter 100 processes output signals of the circuit 1722 and 1724.

At step 1650, the meter 100 re-calculates the results of measurements and calculations performed using output signals of the circuit 1722 and 1724 to compensate for the gain adjustments of step 1630. The re-calculated data for the actual values of the supply voltages $V_S$, supply currents $I_S$, energy, revenue, and other monitored or measured parameters and properties is then selectively displayed on the front panel display 132 or, using the communications module 140, forwarded to the respective addressee of the meter 100.

Figure 18:
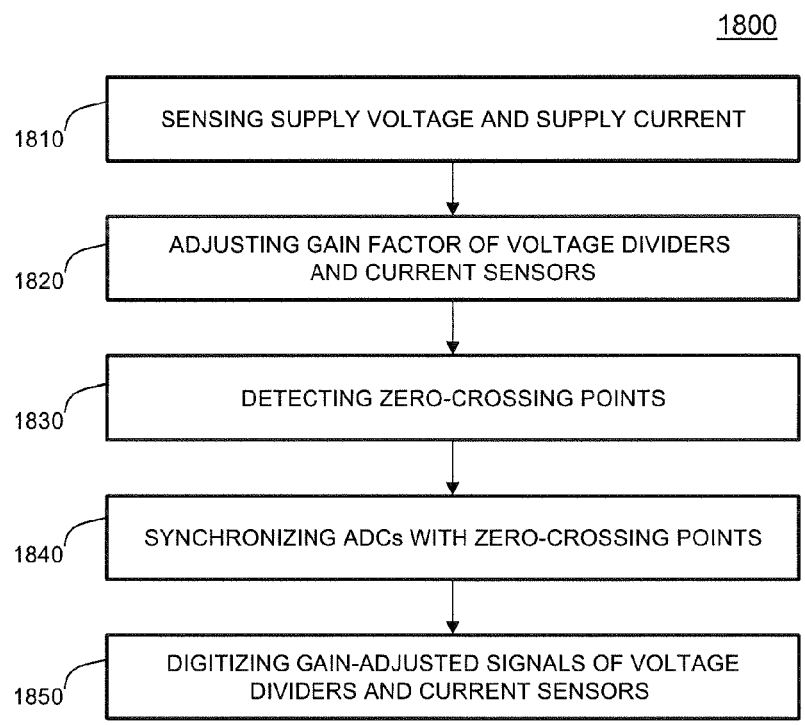
FIG. 18 is a high-level flow chart of a method for sampling supply voltages and supply currents in a metering module of the meter of FIG. 1.
Figure 19:
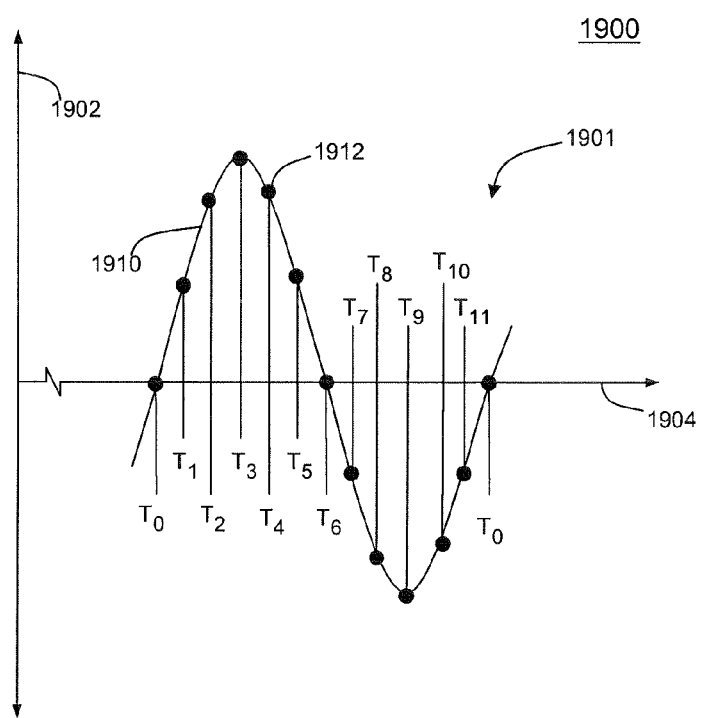
FIG. 19 is an exemplary timing diagram illustrating the method of FIG. 18.

FIG. 18 depicts a high-level flow chart of a method 1800 for sampling supply voltages $V_S$ and supply currents $I_S$ in the metering module 110 of the meter 100 of FIG. 1 in accordance with one embodiment of the present disclosure, and FIG. 19 is an exemplary timing diagram illustrating the method 1800. To best understand the disclosure, the reader should to refer to FIGS. 18-19 and FIG. 17 simultaneously.

Referring to FIG. 19, a graph 1900 depicts a cycle of an exemplary waveform 1901 of the supply voltage $V_S$ (or supply current $I_S$) (y-axis 1902) as a function of time (x-axis 1904). Illustratively, the waveform 1901 is digitized at cyclically repeated moments T0-T11, and the corresponding data points are collectively denoted herein using a reference numeral 1912.

At step 1810, the supply voltages $V_S$ and supply currents $I_S$ are sensed using the voltage dividers 1702 and currents sensors 1704 of the sensing circuit 242 (shown in FIG. 17) of the metering module 110.

At step 1820, the gain factors of the voltage dividers 1702 and currents sensors 1704 are adjusted as discussed in reference to the method 1600 of FIG. 16.

At step 1830, the metering module 110 generates zero-crossing signals 1715 (shown in FIG. 17) for the supply voltages $V_S$ and supply current $I_S$. In one embodiment, the metering module 110 detects moments of time when polarity of the waveform 1901 changes from negative to positive (i.e., when the rising waveform 1901 crosses the x-axis 1904). Such moments are referred to herein as zero-crossing points and, in FIG. 19, are denoted as T0. A zero-crossing signal is a pulse signal (not shown) time-locked to a zero-crossing point. In one embodiment, a leading edge of the zero-crossing signal coincides, in each cycle of the waveform 1901, with the moment T0. In an alternate embodiment, the zero-crossing points may refer to the moments when polarity of the waveform 1901 changes from positive to negative (i.e., the moments T6).

At step 1840, the ADCs 1714, 1712 of the data acquisition system 246 in the metering module 110 are synchronized using the zero-crossing signals 1715 (shown in phantom with links 1703, 1705 in FIG. 17). Similarly, the zero-crossing signals 1715 are used to synchronize the ADCs 411-413 in the DSP module 330.

At step 1850, gain-adjusted output signals of the dividers 1702 and currents sensors 1704 are digitized using voltage ADCs 1714 and current ADCs 1712, respectively. The digitized gain-adjusted output signals used in the data acquisition system 246 to measure the supply voltages $V_S$ and supply current $I_S$.

Generally, a sampling rate of the ADCs 1714 and 1712 may be in range from about 12 to 36 KHz, which corresponds to about 200-600 data points per a cycle of the waveform 1901 at the AC frequency of 60 Hz. In one exemplary embodiment, the sampling rate is about 26 KHz.

Figure 20:
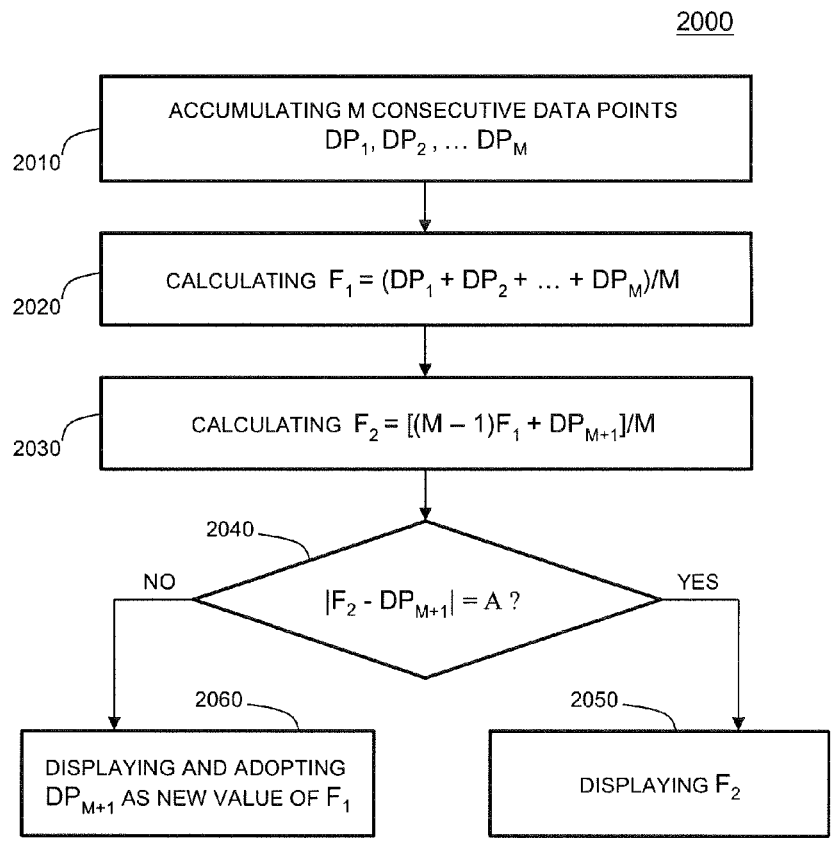
FIG. 20 is a high-level flow chart of a method for displaying controlled parameters in the meter of FIG. 1.
Figure 21:
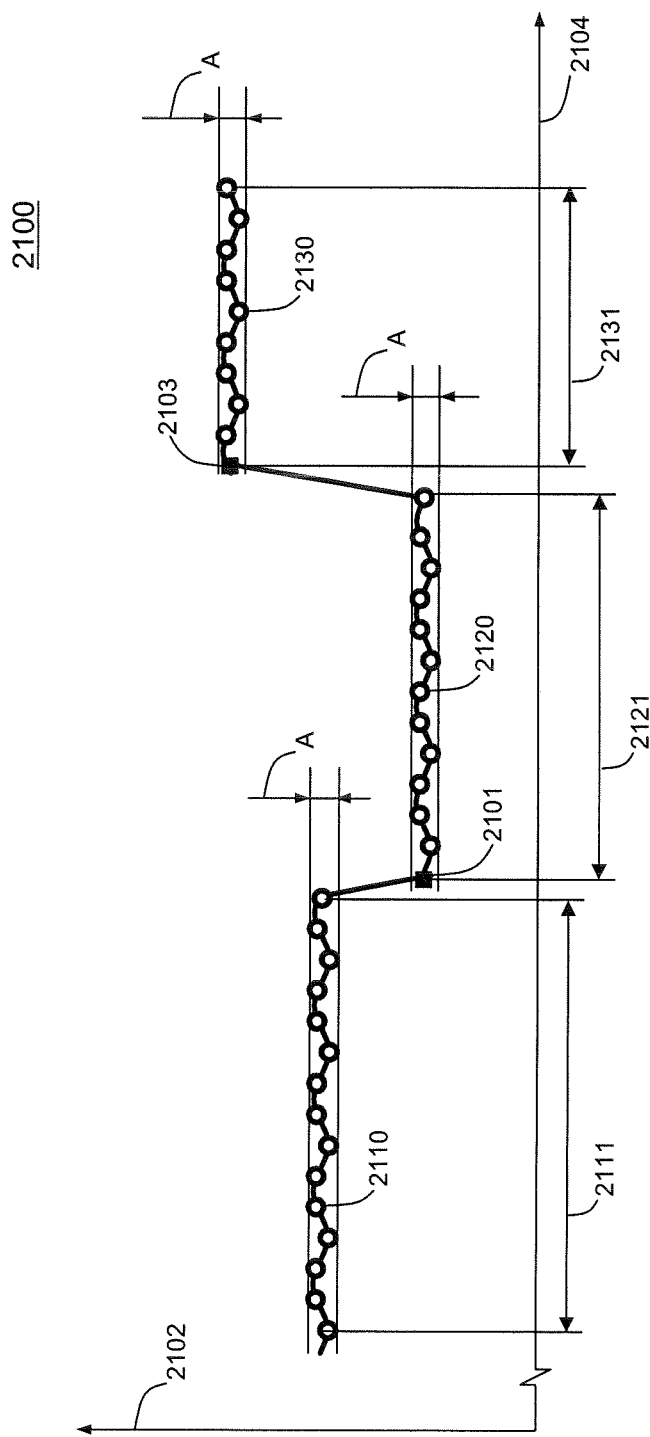
FIG. 21 is an exemplary timing diagram illustrating the method of FIG. 20.

FIG. 20 depicts a high-level flow chart of a method 2000 for displaying controlled parameters in the meter 100 of FIG. 1 in accordance with one embodiment of the present disclosure, and FIG. 21 is an exemplary timing diagram 2100 illustrating the method 2000. To best understand the disclosure, the reader should to refer to FIGS. 20-21 simultaneously.

Referring to FIG. 21, the timing diagram 2100 depicts pluralities of data points 2110, 2120, and 2130 and data points 2101 and 2103, where each of these data points corresponds to a value (y-axis 2102) of an arbitrary parameter P1 displayed on the front panel display 132 as a function of time (x-axis 2104).

At step 2010, in operation, the meter 100 accumulates a pre-determined number M of consecutive data points $DP_1$ through $DP_M$ of the parameter P1, where M>1. Examples of such parameters include supply voltages $V_S$, supply currents $I_S$, energy, or revenue, among other parameters and properties discussed in reference to FIG. 5.

At step 2020, an average value $F_1$ of the data points $DP_1$ through $DP_M$ of the parameter P1 is calculated, $F_1=(DP_1+DP_2+\ldots+DP_M)/M$.

At step 2030, a weighted average $F_2=[(M-1)F_1+DP_{M+1}]/M$ is calculated, where $DP_{M+1}$ is a consecutive (M+1) data point of the parameter P1.

At step 2040, the method 2000 queries if $|F_2-DP_{M+1}|$ is equal to smaller than a pre-determined value, or limit, A (i.e., if $|F_2-DP_{M+1}|\leq A$).

If the query of step 2040 is affirmatively answered, the method 2000 proceeds to step 2050, where a value of the weighted average $F_2$ is displayed on the front panel display 132. Referring to FIG. 21, this condition is met during time intervals 2111, 2121, and 2131.

If the query of step 2040 is negatively answered, the method 2000 proceeds to step 2060, where a value of the data point $DP_{M+1}$ is displayed on the front panel display 132 and adopted as the new average value $F_1$ in calculations of consecutive values of the weighted average $F_2$ for data points accumulated after the data point $DP_{M-1}$. Referring to FIG. 21, this condition is met at the data points denoted using reference numerals 2101 and 2103.

In operation, the method 2000 allows to filter digital noise associated with measurements of the displayed parameters P1. Due to high rates of measuring and calculating parameters of interest in the meter 100, there are no interruptions in displaying such data on the display 132. In particular, a periodicity of calculating a consecutive value of the weighted average $F_2$ is substantially greater then a refreshing rate of the display 132. In one embodiment, using the communications module 140, the meter 100 transmits to the respective addressee the values displayed on the front panel display 132. Alternatively, the meter 100 transmits values of the data points DP.

Figure 22:
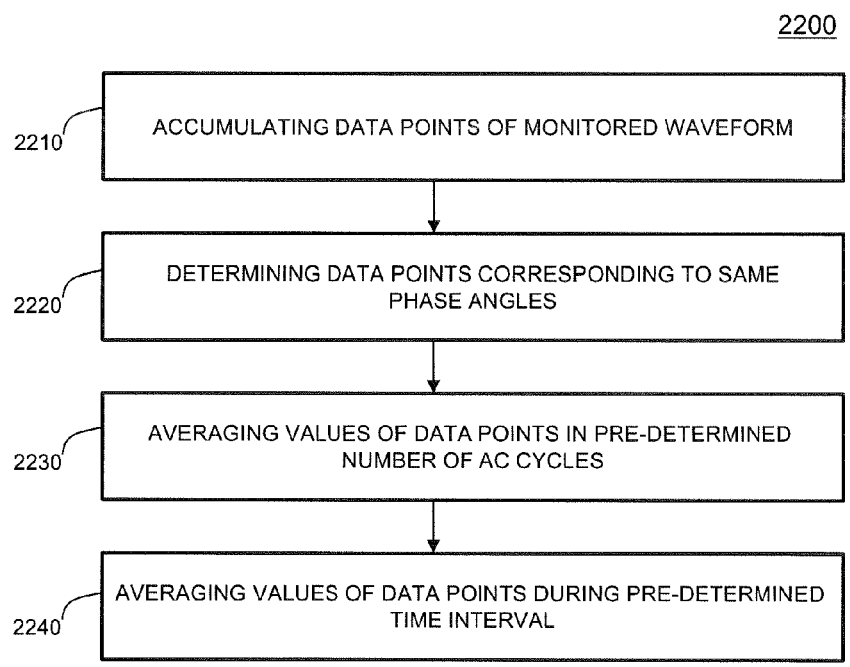
FIG. 22 is a high-level flow chart of a method of averaging data points in the meter of FIG. 1.
Figure 23:
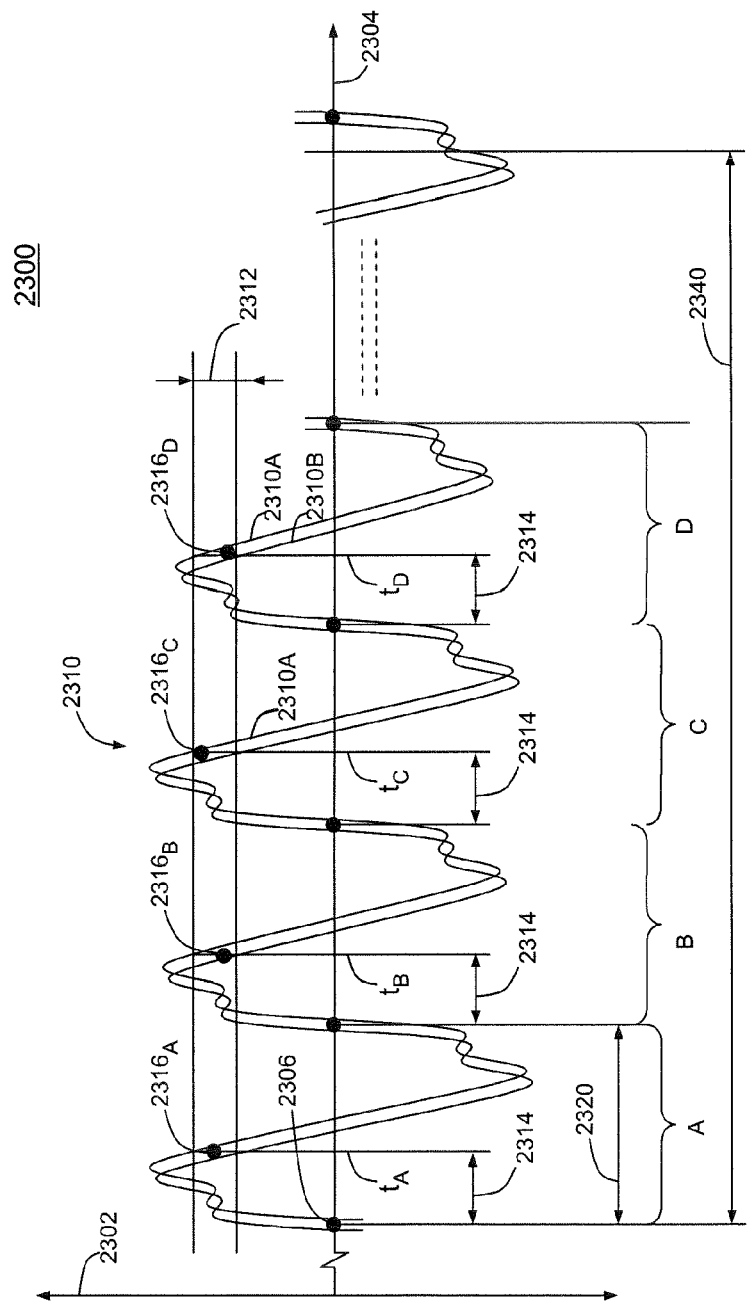
FIG. 23 is an exemplary timing diagram illustrating the method of FIG. 22.

FIG. 22 is a high-level flow chart of a method 2200 for averaging data points in the meter 100 of FIG. 1 in accordance with one embodiment of the present disclosure, and FIG. 23 is an exemplary timing diagram 2300 illustrating the method 2200. To best understand the disclosure, the reader should to refer to FIGS. 22-23 and FIG. 19 simultaneously.

Referring to FIG. 23, the timing diagram 2300 depicts a waveform 2310 of the supply voltage $V_S$ (or supply current $I_S$) (y-axis 2302) as a function of time (x-axis 2304). Illustratively, to show impact of analog noise associated with the waveform 2310, the waveform is depicted as a band having noise-defined boundaries $2310_A$ and $2310_B$. At any moment of time, a measured value of the supply voltage $V_S$ (or supply current $I_S$) is disposed in the respective portion of such a band. In the depicted embodiment, data points $2316_A$-$2316_D$ are measured at exemplary moments $t_A$-$t_D$ corresponding to the same phase angles in their respective AC cycles, and their values are randomly disposed in a range 2312 defined by the boundaries $2310_A$ and $2310_B$.

At step 2210, zero-crossing points 2306 of the waveform 2310 are defined as discussed in reference to FIGS. 18-19 and the waveform is digitized, or sampled.

At step 2220, during consecutive AC cycles 2320 of the waveform 2310 (four AC cycles A-D are shown), pluralities of data points corresponding, in the respective AC cycles, to the same phase angles are selectively measured and identified. Such data points are disposed, on the x-axis 2304, at the same distances from the corresponding zero-crossing points 2306. For example, in the depicted embodiment, corresponding to the same phase angles data points $2316_A$-$2316_D$ are disposed, in their respective AC cycles, at the same distances 2314 away from the zero-crossing points 2306.

At step 2230, values Q of the data points $2316_A$-$2316_D$ are averaged for a predetermined number m of the waveform 2310 (for example, in the depicted embodiment, values $Q_1$-$Q_4$ of four data points $2316_A$-$2316_D$ are averaged). Then, the averaged values $Q_{AVE}$ of the data points are used in the $V_S$ (or $I_S$) based calculations performed in the metering module 110 or the processing module 120. In operation, such averaging of values of consecutive data points corresponding to the same phase angles allows to suppress analog noise in the measurements of the supply voltages $V_S$ and supply currents $I_S$ approximately by a factor of $\{(Q_1)^2+(Q_2)^2+\ldots+(Q_m)^2\}^{1/2}$.

At step 2240, averaging is performed during a pre-determined time interval 2340. In one embodiment, the results of step 2240 are used in the processing module 120 during harmonic analysis (for example, measurements of total harmonic distortion (THD)) of waveform of the supply voltages $V_S$ and currents $I_S$. Typically steps 2220, 2230 and 2240 are performed using the DSP module 330 of the processing module 120.

Figure 24:
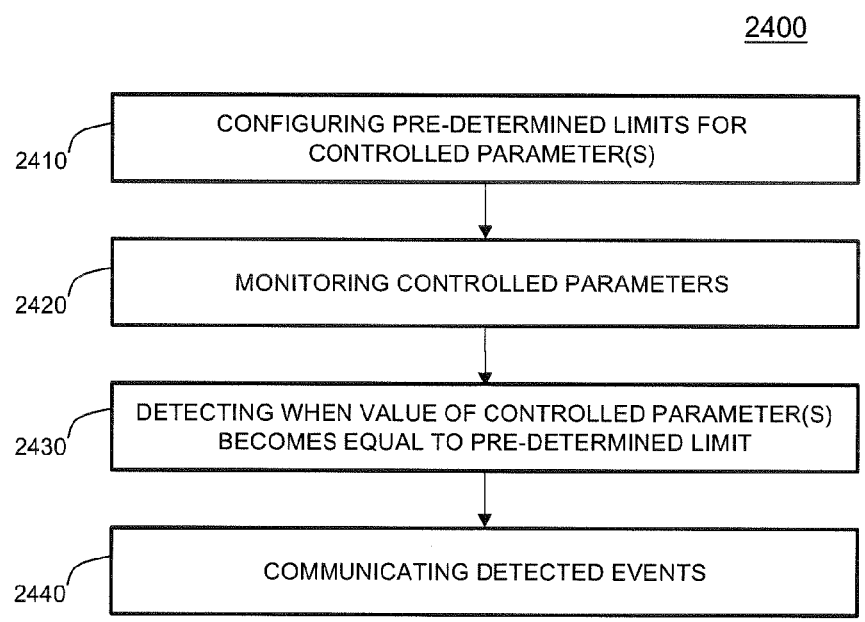
FIG. 24 is a high-level flow chart of a method for providing virtual relays in the meter of FIG. 1.
Figure 25:
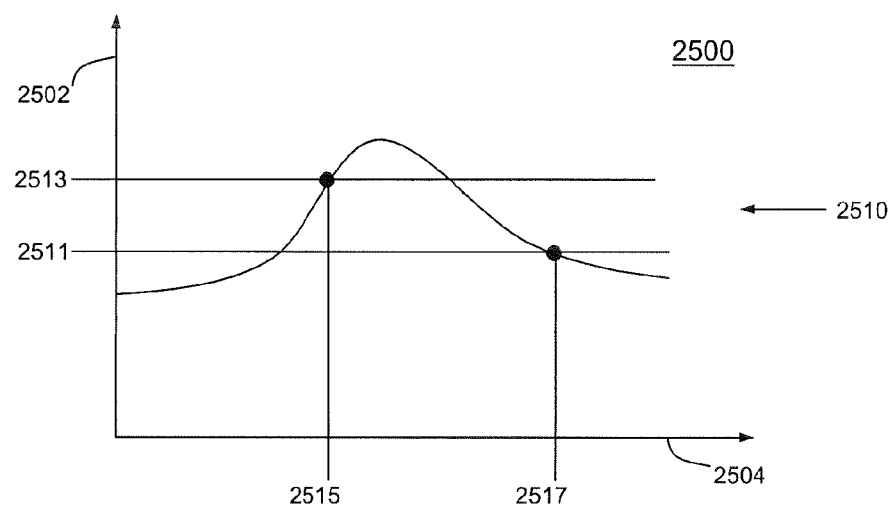
FIG. 25 is an exemplary timing diagram illustrating the method of FIG. 24.

FIG. 24 depicts a high-level flow chart of a method 2400 for providing virtual relays in the meter 100 of FIG. 1 in accordance with one embodiment of the present disclosure, and FIG. 25 is an exemplary timing diagram 2500 illustrating the method 2400. To best understand the disclosure, the reader should to refer to FIGS. 24-25 simultaneously.

Referring to FIG. 25, a graph 2510 depicts a value (y-axis 2502) of a particular controlled (i.e., monitored or calculated) parameter P2 by the meter 100 as a function of time (x-axis 2504). Examples of the parameters P2 include supply voltages $V_S$, supply currents $I_S$, energy, or revenue, among other parameters and properties discussed in reference to FIG. 5.

At step 2410, values of pre-determined constants, or limits, associated with the controlled parameter P2 (illustratively, values 2513 (upper limit) and 2511 (lower limit)) are saved in the meter 100. Such limits may be entered during a process of configuring the meter 100. Alternatively, in operation, the limits may be communicated to the meter 100 via the communications module 140.

At step 2420, the meter 100 measures or calculates values of the parameter P2. In one embodiment, the meter uses method 2200 (discussed in reference to FIG. 22) to reduce noise associated with such measurements.

At step 2430, the meter 100 detects events when a value of the parameter P2 reaches the pre-determined limits (in FIG. 25, the limits 2513 and 2511 are reached at moments 2515 and 2717, respectively).

At step 2440, via the communications module 140, the meter 100 reports the detected events to a respective addressee of the meter 100.

In operation, the meter 100 may similarly monitor a plurality of arbitrary parameters each having a unique set of per-determined limits.

Figure 26:
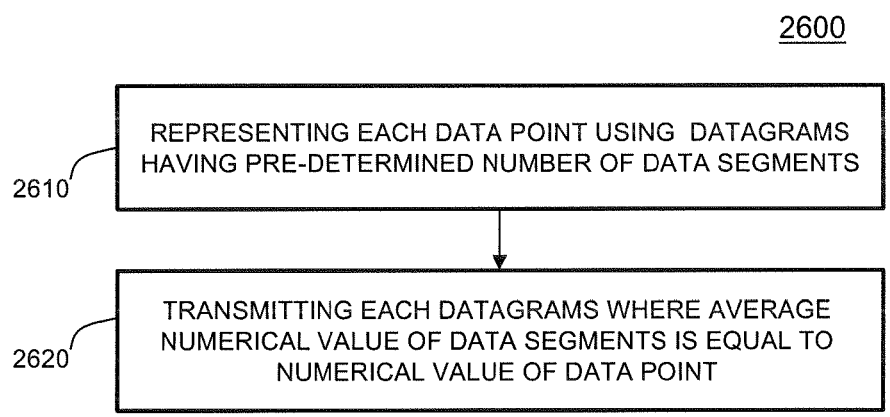
FIG. 26 is a high-level flow chart of a method for transmitting fractional values of a reported parameter in the meter of FIG. 1.
Figure 27:
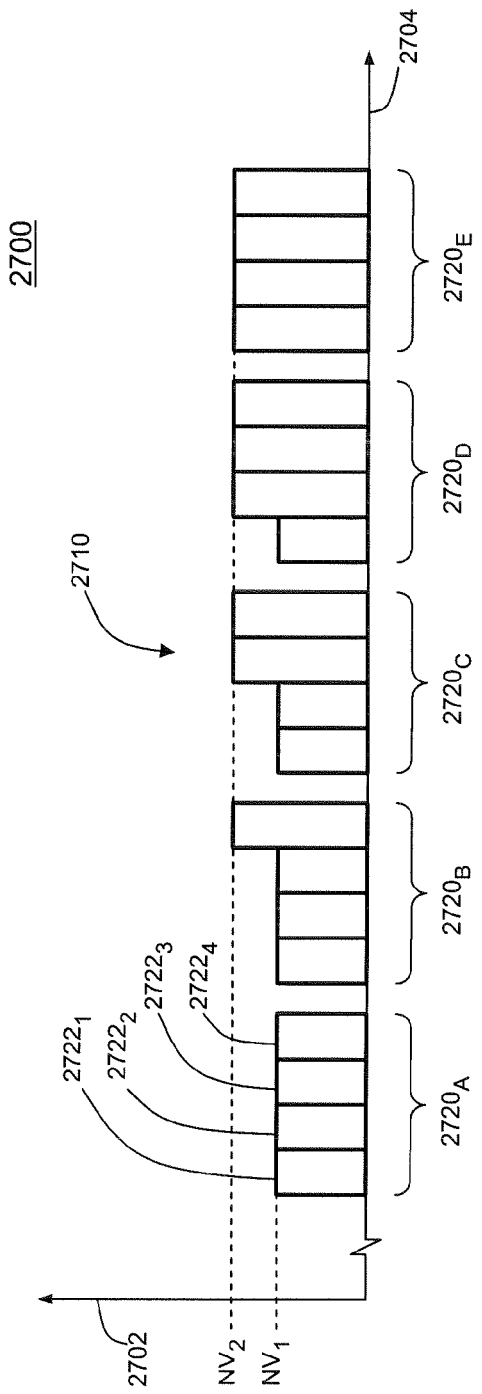
FIG. 27 is an exemplary timing diagram illustrating the method of FIG. 26.

FIG. 26 depicts a high-level flow chart of a method 2600 for transmitting fractional values of an arbitrary reported parameter P3 in the meter 100 of FIG. 1 in accordance with one embodiment of the present disclosure, and FIG. 27 is an exemplary timing diagram 2700 illustrating the method 2600. To best understand the disclosure, the reader should to refer to FIGS. 26-27 simultaneously.

Referring to FIG. 27, a graph 2710 depicts a plurality of datagrams 2720 (datagrams $2720_A$-$2720_E$ are shown) of the parameter P3. Each datagram includes a pre-determined number of data segments (in the depicted embodiment, each of the datagrams $2720_A$-$2720_E$ includes four data segments $2722_1$-$2722_4$). Exemplary numerical values NV (y-axis 2702) of the data segments $2722_1$-$2722_4$ are shown as a function of time (x-axis 2704). Examples of the parameters P3 include supply voltages $V_S$, supply currents $I_S$, energy, or revenue, among other parameters and properties discussed in reference to FIG. 5.

At step 2610, data points of the parameter P3 are measured or calculated in the meter 100. In one embodiment, the data points are defined with accuracy that exceeds binary resolution supported by the communications module 140 or the respective addressee of the meter 100.

At step 2620, a datagram 2720 is assembled and transmitted to the respective addressee.

When a value of a data point to be transmitted is a number that can directly be transmitted by the communications module 140 or recognized by the addressee of the meter 100 (for example, numerical values $NV_1$ or $NV_2$), all data segments 2722 of the respective datagram 2720 have that value. For example, the datagrams $2720_A$ and $2720_E$ include the data segments $2722_1$-$2722_4$ having only the values $NV_1$ and $NV_2$, respectively.

To transmit a fractional value $NV_X$ that can't be directly be transmitted by the communications module 140 or recognized by the addressee of the meter 100, a value of one or more segments 2722 in the respective datagram 2720 is selected such that an average numerical value of the component data segments is equal to the fractional value $NV_X$.

For example, when a difference between the $NV_2$ and $NV_1$ is equal to 1 bit (i.e., $NV_2-NV_1=1$ bit), the datagrams $2720_B$, $2720_C$, and $2720_D$ may be used to transmit fractional, in units of bits, numerical values $NV_B=(0.25)+NV_1$, $NV_B=(0.5)+NV_1$, and $NV_B=(0.75)+NV_1$, respectively. In this example, the method 2700 allows transmitting numerical values of the reported parameter P3 in ¼ of a bit increments, thereby effectively increasing accuracy of the transmitted data by a factor or four. In other embodiments, the datagrams 2720 may include a different number of data segments 2722 or, in a datagram, numerical values of the data segments 2722 may differ by more than 1 bit.

Figure 28:
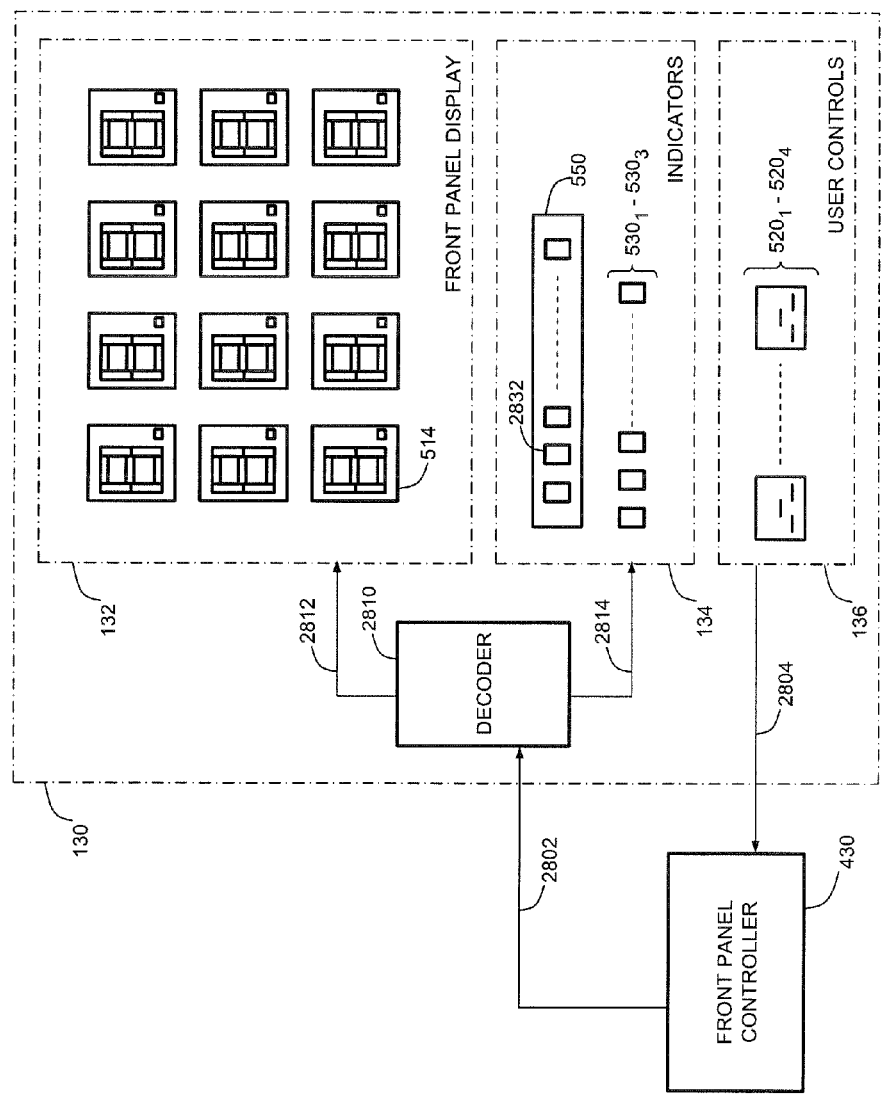
FIG. 28 is a schematic diagram illustrating circuit configuration of a user interface unit of the meter of FIG. 1.

FIG. 28 is a schematic diagram illustrating circuit configuration of the user interface unit 130 of the meter of FIG. 1.

In the depicted embodiment, the front panel controller 430 of the DSP module 330 (discussed in reference to FIGS. 3-4) is connected to a decoder 2810 of the user interface unit 130 and user controls 136 using buses 2802 and 2804, respectively. Generally, the bus 2802 includes serial interface (for example, SPI and the like), and a bus 2804 includes a plurality of lines that selectively initiate particular functions of the meter 100.

In one embodiment, in operation, data carried by the serial interface of the bus 2802 is de-multiplexed in the decoder 2810 that, via display interface 2812 and indicators interface 2814, selectively outputs the de-multiplexed data to the front panel display 132 and indicators 134.

The display interface 2812 comprises lines carrying signals that (i) enable, or "select", the addressed segment 514, and (ii) energize, in the addressed segment 514, sub-segments forming, together, a visible image of a requested alphanumerical symbol. Accordingly, the indicators interface 2814 comprises lines carrying signals that enable and energize one or more of the addressed LEDs.

Figure 29:
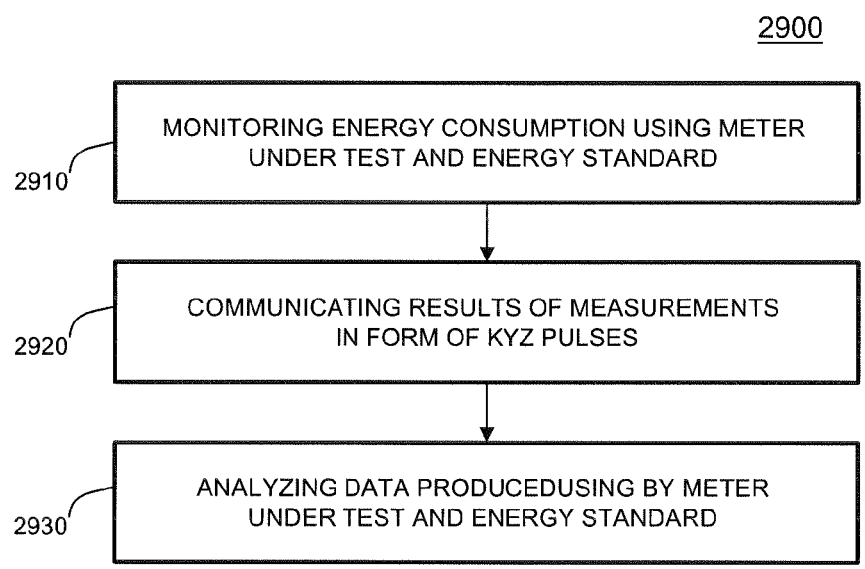
FIG. 29 is a high-level flow chart of a method for verifying energy measurements of the meter of FIG. 1.
Figure 30:
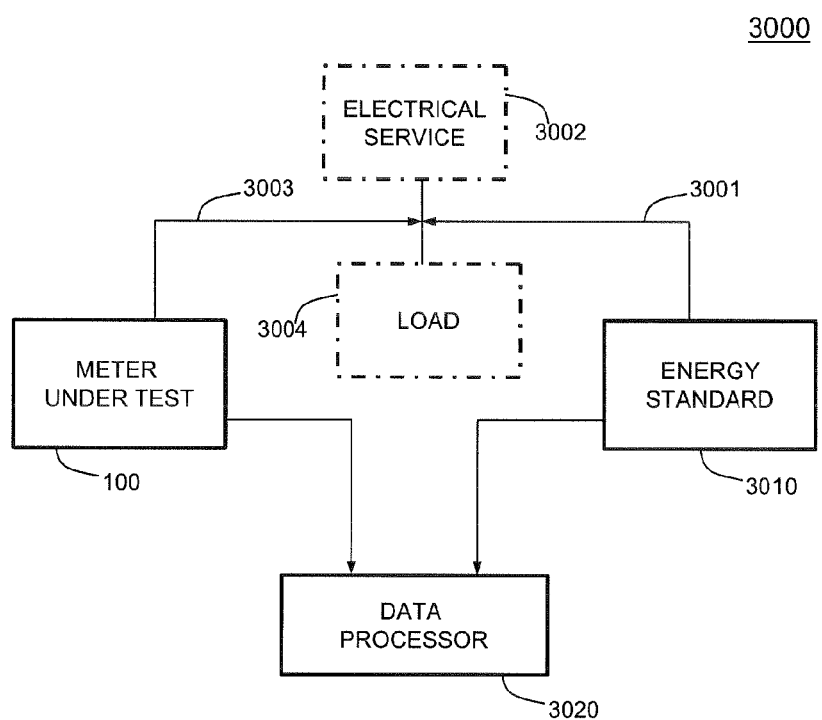
FIG. 30 is a block diagram an exemplary system using the method of FIG. 29.

FIG. 29 depicts a high-level flow chart of a method 2900 for verifying energy measurements of the meter 100 of FIG. 1 in accordance with one embodiment of the present disclosure, and FIG. 30 is a block diagram of an exemplary system 3000 using the method 2900.

Referring to FIG. 30, in one embodiment, the system 3000 includes the meter 100, an energy standard 3010 (for example, legacy electro-mechanical energy meter), and a data processor 3020. In operation, the meter 100 and energy standard 3010 monitor energy consumption (shown with links 30101 and 3003, respectively) by a load 3004 of the electrical service 3002 (both are shown in phantom).

At step 2910, the energy standard 3010 and the meter 100 under test monitor for a pre-determined duration of time energy consumption by the load 3004.

At step 2920, the energy standard 3010 and meter 100 communicate results of energy measurements in a form of industry-standard KYZ pulses.

At step 2930, the result of the measurements are processed by the data processor 3020 that determines accuracy of the meter 100 versus the energy standard 3010.

Figure 31:
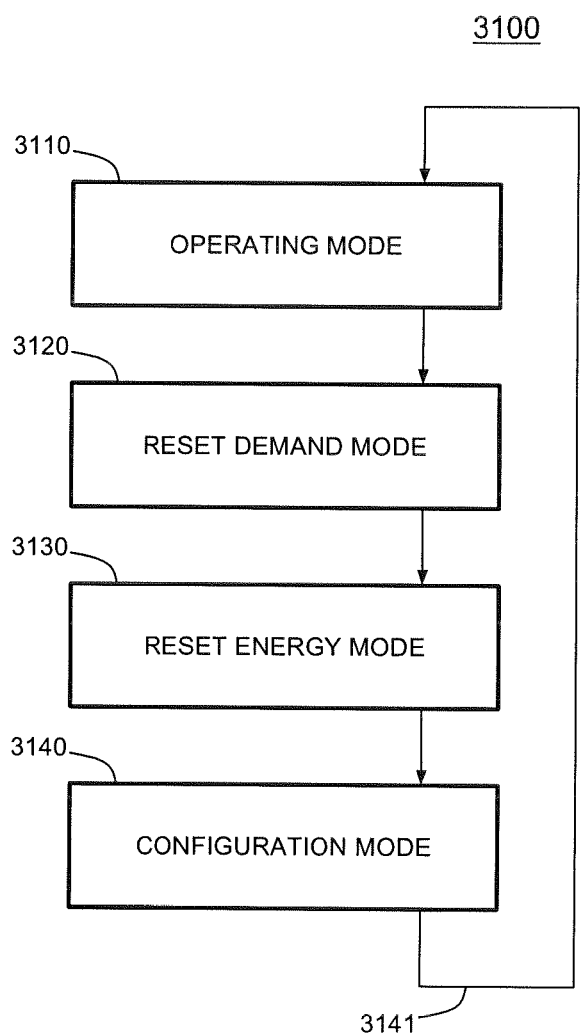
FIG. 31 is a high-level flow chart of a method for configuring functions and settings of the meter of FIG. 1.

FIG. 31 is a schematic diagram 3100 illustrating programmable features of the meter 100 of FIG. 1. The meter 100 may operate in four programmable modes: an Operating Mode 3110, a Reset Demand Mode 3120, a Reset Energy Mode 3130, and a Configuration Mode 3140.

A user may cyclically switch between the modes (shown with a link 3141) and independently program settings for each mode by using the user controls 136 or via the communication unit 140. Each mode is associated with multiple configuration screens that allow the user to select, enter, or modify particular settings (for example, configuration or communications settings, limits discussed in reference to FIGS. 24-25, and the like).

In particular, the Reset Demand Mode 3120 and Reset Energy Mode 3130 allow the user to disable (delete) pre-existing configuration settings and reset energy counters of the meter, respectively. Accordingly, in the Configuration Mode 3140, the user may program functions and settings of the meter 100 that, in the Operating Mode 3110, are executed according to user's instructions.

In a further embodiment of the present disclosure, the IED, e.g., electrical power meter, will perform waveform capture and logging of the monitored voltage and current waveforms based on various triggers, as will be described below. It is to be appreciated that the waveform capture functionality may be implemented in software, firmware and/or hardware, as described above, and includes the following features:

- 2048 samples per capture for each of the 6 channels, e.g., Van, Vbn, Vcn, Ia, Ib, Ic; all channels logged all the time
- User-set sample rate
- User-set pre-trigger
- PQ (i.e., Power Quality) events monitored include Voltage Surge & Sag and Current Surge
- Events based on RMS for 1 cycle, updated every half cycle
- Events based on adaptive RMS
- Events based on wave shape
- User-set PQ event thresholds with individual enables for each event for each channel
- PQ events cross-referenced to captured waveform data
- Capture triggers selected from the enabled PQ events
- Minimum of 2 back-to-back captures guaranteed if a second trigger occurs
- Capture trigger via Modbus The various features and parameters of the waveform capture and logging functionality are user programmable, for example:

Sample Rate (@ nominal 60 Hz)
- 32, 64, 128, 256, 512 are standard
- 1024 is enabled via V-switch technology as disclosed in U.S. Pat. No. 7,184,904, the contents of which are incorporated by reference
- user selects one Number of Pre-trigger Cycles (@ nominal 60 Hz)
- anything from 1 to all but 1

RMS Trigger
- for WYE, applies to Van, Vbn, Vcn, Ia, Ib, Ic
- for DELTA2CT, applies to Vab, Vbc, Vca, Ia, Ic
- for 2.5ELEMENT, applies to Van, Vcn, Ia, Ib, Ic
- specified as % full scale
- each voltage channel has 2 thresholds (surge & sag)
- each current channel has 1 threshold (surge)
- calculated every cycle
- calculated every half cycle using samples for a whole cycle
- user selects which channels to enable and sets their threshold percentages Adaptive RMS Trigger
- applies to voltage channels for the particular hookup
- specified as % full scale (same as plain RMS trigger)
- based on RMS measured by power chip and averaged over 10 minutes
- no triggers for first 10 minutes
- each voltage channel has 2 thresholds (surge & sag)
- trigger calculated every half cycle using samples for a whole cycle
- user selects which channels to enable and sets their threshold percentages
- all 3 voltage channels use the same kind of RMS triggers (all are plain or all are adaptive)

Wave Shape Trigger
- applies to voltage channels for the particular hookup
- specified as % full scale, defines a window above and below waveform
- not standard, enabled via V-switch
- can be set in addition to either RMS trigger
- user selects which channels to enable and sets a threshold for each Manual Trigger
- user writes the password to a Modbus register to force a trigger
- no user setting needed The IED firmware design reserves 32K words of RAM, e.g., RAM 322 as shown in FIG. 3, to support waveform capture and logging. The waveform capture design allocates this memory as 4 buffers:

Frequency-locked sample buffer. Also used for THD (i.e., total harmonic distortion), this holds 256 samples per cycle for 2 cycles on each of the 6 channels. [256*6 channels*2=3072]

RMS buffer. This holds the results of the RMS and waveshape calculations for each channel every [half] cycle, thus forming a historical record extending back in time. We use it to postpone capture trigger evaluation until the capture is guaranteed to be complete. [(6 RMS values+1 tag+1 flag word)*~140 half cycles @ 65 Hz=1120]

Time-locked sample buffer. This is the large buffer that holds waveform samples, also called the capture buffer. The time locked ADC ISR stores incoming samples in this buffer at the user defined sample rate. It is sized to hold 1 complete capture plus a generous margin for synchronization and pipeline delays. RMS and wave shape calculations occur on the [half] cycle using this buffer's data. [2048*6 channels=12288+predetermined margin]

Auxiliary buffer. This buffer holds a capture while it is being written to flash. It is sized to hold 1 complete capture plus some overhead for summary or split records. [12288 sample data+(512+6) summary record=12806]

Figure 32:
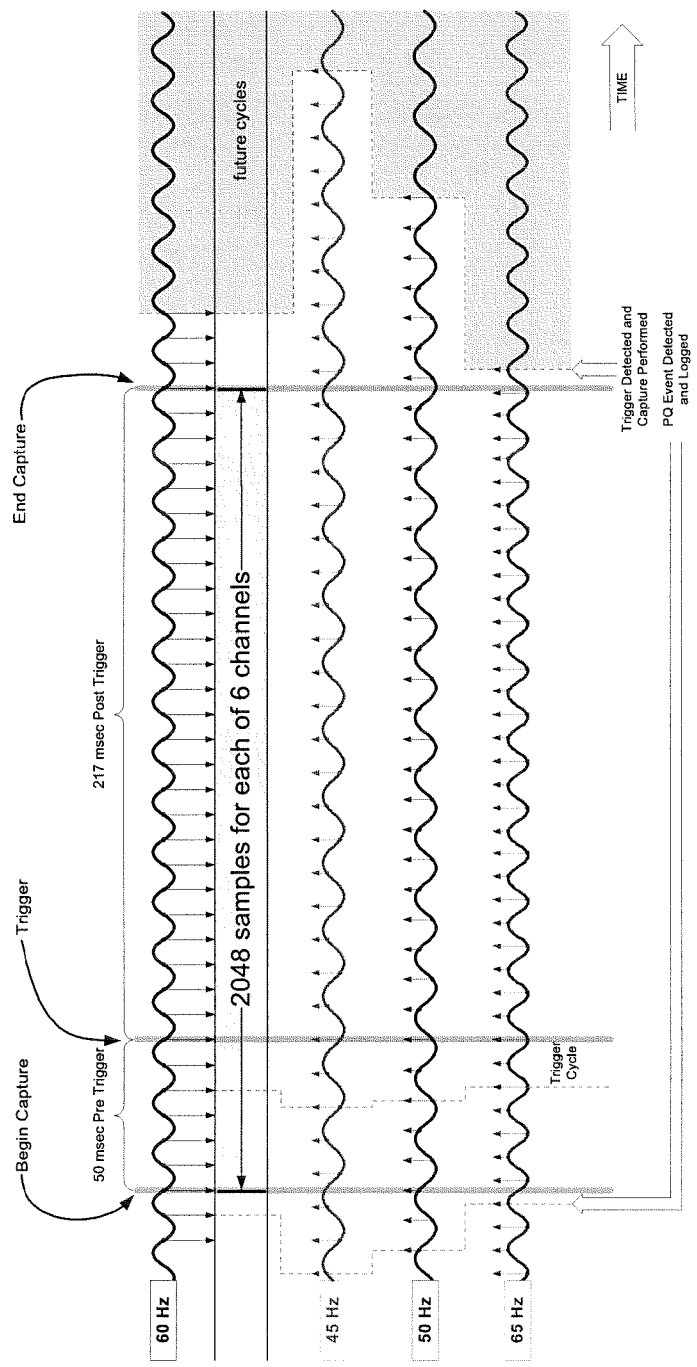
FIG. 32 is a graph illustrating waveform capture performed by the meter of FIG. 1.

Referring to FIG. 32, operation of the waveform capture is illustrated. The three voltage channels and three current channels are continuously sampled and sent to the frequency-locked sample buffer and time-locked sample buffer. The analog voltage and current signals are received via lines 1719 and 1721 in the DSP module 330. Synchronization between the 2 sample buffers, i.e., the frequency-locked sample buffer and time-locked sample buffer, is accomplished via tags. When storing the last frequency-locked sample of each half cycle, a snapshot of the time-locked sample buffer's index is saved. This tag goes into the RMS buffer along with its associated RMS values. FIG. 32 illustrates how the buffers relate to each other, to time, and to input signals of various frequencies. It uses 128 samples per second with three (3) 60 Hz cycles of pre-trigger and has a uniform time axis. Tags are represented by the arrows pointing to the samples buffer. Processing on the half cycle is illustrated although it is in within the scope of the present disclosure to use full cycles, which would changes the buffer depth but not the overall method.

Referring to FIG. 32, four waveforms are shown. The top one is 60 Hz and serves as the reference for the user-set pre and post trigger values. The other 3 represent incoming data at 3 different frequencies, 45 Hz & 65 Hz because these are the design limits, and 50 Hz because it is a typical likely value along with 60 Hz. The middle gray line represents the trigger as denoted in the figure. The other 2 gray lines are the beginning and end of a capture, which includes 2048 samples for each of the six (6) channels.

The trigger cycle is the one that ends at the middle line denoted as trigger in FIG. 32. The user selects the pretrigger as a number of 60 Hz cycles that precede this line, 3 in this example. 3 cycles at 60 Hz is 50 msec. The user also sets the sample rate as a number of samples per 60 Hz cycle. This is 128 in this example. 128 samples per 60 Hz cycle is 0.13 milliseconds per sample, so a capture of 2048 samples represents 267 milliseconds. Thus the user has set up his capture to show 50 ms of data before the trigger and 217 ms after for a total of 267 ms.

The arrows pointing down from the 60 Hz reference signal represent half cycles. The arrows pointing up from the 3 incoming data streams are their half cycle points. These are significant because all processing occurs on the half cycle of the incoming signal. Because we defer checking for triggers until all data for a possible capture is present in the buffers, the decision that the trigger occurred happens not at the gray line but rather at the dotted line on the right that delineates the shaded area, i.e., trigger detected and capture performed. The corresponding dotted line on the left shows what data is in the buffers at that instant in time. The data saved for the capture will fall between the 2 outer gray lines regardless, i.e., begin capture and end capture, but the internal memory arrangement is able to handle any frequency without knowing ahead of time what the frequency will be.

As sample data arrives, RMS is calculated for each cycle (or half cycle) and saved in a FIFO buffer. At the time of evaluation (right dotted line), the RMS value for the trigger cycle is at a known point in the RMS FIFO. In the depicted example, this is exactly 29. On all 4 waveforms, there are 29 arrows from trigger to detection point.

The chosen configuration (e.g., 128 samples per second and 3 pretrigger cycles) equates to 50 msec pre-trigger and 217 msec post-trigger or 267 msec overall. Note that at 65 Hz, there are 3.25 cycles in the pre-trigger interval and 14.08 in the post. This sets the parameters for evaluation. The processing forms a pipeline in which evaluation occurs on the half cycle. Each half cycle, the RMS buffer item 29 half cycles back in time is evaluated for a trigger condition. Timing of this activity is delineated by the seam between past (unshaded section) and future (shaded section) times. If a trigger is found, the tag for that cycle is used to determine the indexes pre and post that form the block of samples to be logged. These beginning and ending tags are remembered or stored. These are new tags and typically will not align with any of the half cycle tags.

So that PQ (Power Quality) event cycles can be linked to their associated captures, PQ evaluation of these cycles is postponed until they have passed beyond the capture window. In the example case, this is 7 half cycles before the trigger and 36 before the just-completed half cycle. If a PQ event is found, it is logged at this time. Using the beginning and ending tags of the capture, if any, the PQ event is linked to its capture waveform before the PQ record goes to flash.

The number of half cycles' lag for PQ and trigger evaluation will change according to the user's pre-trigger and sample rate selections. These counts are determined once at startup and remain constant thereafter. By using the numbers for the worst case (65 Hz), correct operation at any frequency can be guaranteed.

The worst-case lags occur at 45 Hz. In the example, capture of the waveform occurs 4.5 cycles later than it might, or 100 msec. Logging of PQ records occurs 18 cycles after they occur, or 400 msec. For the more typical 60 Hz case, these values are 25 and 300 msec, respectively. Note that it will take about 240 msec to save the waveform capture to memory, e.g., flash memory.

Performing a capture once the trigger has been recognized involves the following steps:

1. calculate the beginning and ending indexes for the capture (An index is an offset into the buffer for any particular memory word. The buffers are circular, so the start and end memory words might be anywhere in the buffer. Determining a start and end indexes identifies which part of the buffer to copy and where to begin and end.)
2. copy that portion of the time-locked sample buffer to the aux buffer
3. assign a capture number 4. construct the record and save it in flash, and
5. wait for flash operation to be complete.

If a second trigger is identified before flashing the first capture completes, the second capture will exist in the capture buffer but the remaining part of the buffer is too small to hold another capture so the buffer will stall. As soon as the first capture is flashed, the second can begin flashing and the stall will be canceled. Cycles occurring during a stall cannot become part of a capture. The RMS buffer never stalls, however, so all cycles will continue to be checked for PQ events. After a stall is canceled, no additional captures can occur until the capture buffer refills.

A full capture includes 2048 samples for 6 channels (24576 bytes), e.g., three current and three voltage, plus associated record overhead and trigger information. Each capture will be stored as a set of 26 waveform log records. The first record holds summary information for the capture as a whole plus the start of the sample data. The remaining 25 records hold all remaining samples for all channels. This yields a record size of 976 bytes. Keeping the records close to the size of the log retrieval buffer prevents buffer size difficulties during retrieval. The set of log records will contain:

Timestamp (in the record header)
RMS values for all channels in the trigger cycle
Capture number
Tag for the trigger [half] cycle
ADC calibration for each channel
Sample rate
Trigger type (RMS, adaptive RMS, wave shape, manual, etc.)
Flag(s) to indicate contiguity of one capture with another
2048 words of sample data PQ (Power Quality) log records will contain:
Timestamp (in the record header).
Event identification, i.e. present state & change flags for each channel
Capture number and tag of the [half] cycle causing the event. Capture number will be zero if the event cycle isn't in a capture.
Additional flags to indicate whether or not the cycle is in a capture, and if the cycle is only partially in the capture.
For departure events, RMS values will be zero.
For return to normal events, worst-excursion RMS values for the channels that returned. Other channels will be zero It is to be appreciated that events generate a PQ log record, independent of whether or not they are captured. Multiple events in a single cycle only generate one PQ log record. Triggers and PQ events are located by tag numbers. At high sample rates, two contiguous captures can be logged but subsequent captures will not be contiguous. A second trigger within a capture will cause an additional capture to be queued. The additional capture may or may not have the prescribed pre-trigger but will be contiguous with the first. The same holds true if the second trigger occurs up to and including its normal trigger position. If it occurs after that, a second capture will occur but it won't be contiguous.

Performance
Multiple Captures

The relative timing between trigger events leads to different capture results. In all cases, a PQ log record is generated for each cycle that contains a trigger event.

TABLE 1

Summary of nominal cycles in capture buffer vs. sample rates:

| User selected sample rate | 60 Hz cycles in capture buffer | time to fill capture buffer | nominal time to flash capture |
|---|---|---|---|
| 1024 | 2 | 0.033 S | 0.240 S |
| 512 | 4 | 0.067 S | 0.240 S |
| 256 | 8 | 0.133 S | 0.240 S |
| 128 | 16 | 0.267 S | 0.240 S |
| 64 | 32 | 0.533 S | 0.240 S |
| 32 | 64 | 1.067 S | 0.240 S |

Refer to Table 1.

If the sample rate is 128 samples per 60 Hertz cycle or slower, writing a capture to the memory, e.g., flash, can be completed in less time than it takes to refill the capture buffer. This means that, if events warrant, contiguous captures can be saved to flash until the meter runs out of erased flash. At sample rates above 128 (256, 512, and 1024) a stall will develop if a trigger event is detected while both the capture and aux buffers are in use. Regardless of sample rate, during a flash sector erase, capture will stall if both the capture buffer and the auxiliary buffer fill before the erase completes.

In summary, if the average period of trigger events is less than the flash write time, capturing must stall occasionally and only PQ log records will mark events while a save to flash completes. If the average period of the trigger events is more than the flash write time, capture will stall only if a new event is detected before 2 previous captures have been written to flash.

In another aspect, the system further includes an envelope type waveform trigger, wherein the envelope type waveform trigger generates a trigger upon detection of samplings of the at least one scaled, split signal exceeding at least one threshold voltage. The envelope type waveform trigger is implemented by firmware in processing module 120.

In a further aspect, the envelope type waveform trigger is determined by, $$Vt1-Vth1<Vt2<Vt1+Vth2$$

where Vt1 is a voltage sampled at time T1 and Vt2 is a voltage sampled at time T2 which is one cycle after time T1 and Vth1 is a first and lower voltage difference and Vth2 is a second and upper voltage difference so that a bracket is formed surrounding Vt1 that Vt2 is expected to fall within. Thus, if the signal does not exceed the upper threshold voltage (=Vt1+Vth2) or fall below the lower threshold voltage (+Vt1−Vth1) there will be no trigger on the envelope type waveshape. It is envisioned by the present disclosure that there may be additional techniques to determine waveform transients and as such they are considered as part of this disclosure. Such techniques include calculating a waveshape quality value by conducting a Fourier transform on the digital samples and then determining the extent of harmonics on the waveform. If the harmonic magnitudes or the total harmonic distortion exceed a desired threshold, then it is determined that the waveshape is not within acceptable standards and, thus a trigger occurs.

Another feature of the IED of the present disclosure is a rate of change feature. This feature tests the current RMS values of the scaled and conditioned current inputs. Again, this feature is implemented by firmware within the processing module 120 of the IED and by way of non-limiting illustrative example the processor can trigger on a rate of change, which is defined as the ratio of the present RMS value and the previous RMS value. If the rate of change is above the threshold, then it triggers alerting the user that the rate of change has been exceeded.

The waveform envelope filter or the RMS triggers of the waveform recording can be configured to also perform an adaptive trigger in which the values of the triggers will adapt to the steady state power system voltage. As exemplary technique concerning this type of waveform recording includes collecting 15 minutes of one second updated voltage RMS values (900 values). Then running either a block average or a rolling block average or other type of average on the readings. A block average technique consists of adding the 900 voltage readings and dividing by 900 to provide the 15 minute average reading. A rolling average consists of calculating the same block average for the voltage, but rolling the block average over a predetermined interval. Thus, a user selects 3 intervals, then the calculation will be done 3 times in the 15 minute period by adding 900 of the previous 15 minute samples every 5 minutes. It is conceived by this invention that other averaging techniques may be used. Once the average is calculated, then the IED will change the triggers assuming that the nominal voltage has changed to the new average voltage value.

The following is an exemplary technique concerning an adaptive trigger. For this example, a simple RMS trigger will be used, however, it is contemplated by the present disclosure that adaptive trigger can be used by any of the triggering techniques. Typical power systems utilize either a 120 volt, 69 volt or 220 volt Phase to Neutral nominal. A nominal voltage is generally the base voltage that is provided to a customer. For this example, it is presumed that a base voltage is 120 volt nominal. Many factors, however, could cause the base voltage to be slightly higher or lower than a perfect nominal. For instance, when a power system is heavily loaded, it may not be able to supply a full 120 volts. Often utility providers can have voltage drift down to 108 volts at full load. If a customer programs the voltage RMS trigger to trip and record an event below 5% of nominal and the nominal is set to 120 volts, the IED will be in a constant trip/recording mode. This is not advantageous because it could cause the IED to record or trip for steady state conditions thus using all the memory resources to store these events and as such, the IED could record over other useful prior events. Thus, the adaptive algorithm looks at the average voltage to determine what the new nominal condition is and then compares the limit to the new "nominal" value based on the average voltage. This adaptation assures that the IED is recording events that are actually not stead state conditions. It is conceived that there are multiple methods that can be used to create an adaptive trigger and that any alternative methods are envisioned by this invention.

Programmable Settings
Trigger Events bit mapping:

| manual | not used | | | Voltage Shape | | | Voltage Sag | | | Current Surge | | | Voltage Surge | | |
|---|---|---|---|---|---|---|---|---|---|---|---|---|---|---|---|
| trigger | 0 | 0 | 0 | C | B | A | C | B | A | C | B | A | C | B | A |
| 15 | 14 | 13 | 12 | 11 | 10 | 9 | 8 | 7 | 6 | 5 | 4 | 3 | 2 | 1 | 0 |

Registers:

| | | |
|---|---|---|
| 1 byte | sample rate | byte = 5 to 10; rate = (2 ^ byte) samples per cycle at 60 Hz, i.e. 2^5 = 32, 2^6 = 64, ... 2^10 = 1024 |
| 1 byte | pre-trigger | byte = 1 to n − 1; n is the number of (nominal) cycles per capture |
| 1 word | PQ enables | see events mapping above; manual trigger bit doesn't apply |
| 1 word | trigger qualifiers | always 0 |
| 3 words | Va, Vb, Vc surge RMS | 1 word per channel; word = % full scale (formatted like limits); 0 disables VRMS surge triggering for the channel |
| 3 words | Va, Vb, Vc sag RMS | 1 word per channel; word = % full scale (formatted like limits); 0 disables VRMS sag triggering for the channel |
| 3 words | Ia, Ib, Ic surge RMS | 1 word per channel; word = % full scale (formatted like limits); 0 disables IRMS surge triggering for the channel |
| 3 words | Va, Vb, Vc wave shape threshold | always 0 |

Log Record Formats

Waveform Record (26 per capture, 976 bytes per record)

| No. Byte(s) | Contents | Notes | Byte Offset |
|---|---|---|---|
| 12 | Record Header | All 26 records of a capture have the same timestamp | 0 |
| 1 | Capture Number | All 26 records have the same capture number. | 12 |
| 1 | Record Number | records in a capture are numbered from 0 to 25 | 13 |
| 962 | Record Payload | All 26 record payloads together form a composite structure holding all data for the capture. See "waveform capture data organization" below. | 12 |

Timestamp applied is the time that the trigger was recognized.

Captures are numbered from 1 to 255, then back to 1 again. Numbering will be consecutive from one capture to the next as long as there is no reset. A capture number of 0 may appear in a PQ record, indicating that there is no associated capture for the PQ cycle, but not in a waveform record.

Waveform capture data organization (after record headers, capture numbers, and record numbers have been stripped):

| No. Byte(s) | No. Word(s) | Data |
|---|---|---|
| 36 | 18 | Information about the capture other than actual samples. See "non-sample capture info" below. |
| 388 | 194 | Reserved, always 0xFF |
| 2 | 1 | Channel ID for Van or Vab = "AN" or "AB" |
| 4096 | 2048 | Van or Vab samples |
| 2 | 1 | Channel ID for Ia = "IA" |

| No. Byte(s) | No. Word(s) | Data |
|---|---|---|
| 4096 | 2048 | Ia samples |
| 2 | 1 | Channel ID for Vbn or Vbc = "BN" or "BC" |
| 4096 | 2048 | Vbn or Vbc samples |
| 2 | 1 | Channel ID for Ib = "IB" |
| 4096 | 2048 | Ib samples |
| 2 | 1 | Channel ID for Vcn or Vca = "CN" or "CA" |
| 4096 | 2048 | Vcn or Vca samples |
| 2 | 1 | Channel ID for Ic = "IC" |
| 4096 | 2048 | Ic samples |

Example: 26-record data stream (Wye hookup and normal scope assumed)

| | | |
|---|---|---|
| record 0 | 6 | record header |
| | 0 | capture N, record 0 |
| | 1 | non-sample capture info |
| | 2 | FFs |
| | 3 | Van Channel ID |
| | 4 | 268 Van samples |
| records 1-3 | 6 | record header |
| | 5 | capture N, record # |
| | 6 | 481 Van samples |
| record 4 | 6 | record header |
| | 7 | capture N, record 4 |
| | 8 | 337 Van samples |
| | 9 | Ia Channel ID |
| | 10 | 143 Ia samples |
| record 5-7 | 6 | record header |
| | 11 | capture N, record # |
| | 12 | 481 Ia samples |
| record 8 | 6 | record header |
| | 13 | capture N, record 8 |
| | 14 | 462 Ia samples |
| | 15 | Vbn Channel ID |
| | 16 | 18 Vbn samples |
| record 9-12 | 6 | record header |
| | 17 | capture N, record # |
| | 18 | 481 Vbn samples |
| record 13 | 6 | record header |
| | 19 | capture N, record 13 |
| | 20 | 106 Vbn samples |
| | 21 | Ib Channel ID |
| | 22 | 374 Ib samples |
| record 14-16 | 6 | record header |
| | 23 | capture N, record # |
| | 24 | 481 Ib samples |
| record 17 | 6 | timestamp |
| | 25 | capture N, record 17 |
| | 26 | 231 Ib samples |
| | 27 | Vcn Channel ID |
| | 28 | 249 Vcn samples |
| record 18-20 | 6 | timestamp |
| | 29 | capture N, record # |
| | 30 | 481 Vcn samples |
| record 21 | 6 | timestamp |
| | 31 | capture N, record 21 |
| | 32 | 356 Vcn samples |
| | 33 | Ic Channel ID |
| | 34 | 124 Ic samples |
| record 22-25 | 6 | timestamp |
| | 35 | capture N, record # |
| | 36 | 481 Ic samples |

Non-sample capture info (36 bytes total)

| No. Byte(s) | Contents | Notes | Byte Offset |
|---|---|---|---|
| 1 | Sample Rate | from Programmable Settings | 0 |
| 1 | Flags | bit mapped. B0 set indicates this capture is contiguous with the previous capture; other bits not used, always 0. | 1 |
| 1 | Trigger Type | 0 = normal RMS, 1 = adaptive RMS, 2 = wave shape, 3-255 = other | 2 |
| 1 | Reserved | always 0xFF | 3 |
| 2 | Trigger Source | bit mapped per PQ enables above | 4 |
| 2 | Trigger Cycle Tag | 0-65535 | 6 |
| 2 | First Sample Tag | 0-65535 | 8 |
| 2 | Last Sample Tag | 0-65535 | 10 |
| 2 | Trigger Cycle RMS for Van/Vab Channel | value 0-TBD in TBD units | 12 |
| 10 | Trigger Cycle RMS for Remaining Channels | channels in order Ia, Vb, Ib, Vc, Ic; value & units same as above | 14 |
| 2 | Va Sample Calibration | value 0-TBD. Apply to each Va sample to obtain actual voltage sampled. See later TBD section for hookup conversions/interpretations. | 24 |
| 2 | Ia Sample Calibration | same as above except there are no hookup issues | 26 |
| 4 | Vb & Ib Sample Calibrations | same as Va & Ia above | 28 |
| 4 | Vc & Ic Sample Calibrations | same as Va & Ia above | 32 |

PQ Event Record (64 bytes)

| No. Byte(s) | Contents | Notes | Byte Offset |
|---|---|---|---|
| 12 | Record Header | | 0 |
| 2 | Present States | bit mapped per PQ enables above; 0 indicates an untriggered state | 12 |
| 2 | Event Channels | bit mapped per PQ enables above; 1 indicates a channel changed state and that the change to the present state caused the event | 14 |
| 12 | Worst Excursion RMS | For events ending a surge or sag episode (e.g. return to normal), RMS of the channel is the worst excursion (highest surge, lowest sag) for the episode. 0 for other channels. Same units as Waveform Records. | 16 |
| 1 | Capture Number | 0 if cycle not captured, 1-255 if all or part of the cycle was captured | 28 |
| 1 | Flags | TBD | 29 |
| 2 | Event Cycle Tag | Tag of the last sample in the event cycle | 30 |
| 32 | not used | always 0 | 32 |

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the present disclosure is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. An intelligent electronic device, comprising:
   a metering module that measures at least one parameter of an AC electrical service; and
   a processing module that processes data obtained using the metering module, the processing module performs calibrating measurements of the at least one parameter at a plurality of calibrating points at a plurality of calibrating frequencies,
   wherein results of measuring the at least one parameter are linearly interpolated using data of the calibrating measurements at the calibrating frequencies adjacent to a data point of the at least one parameter.

2. The device of claim 1, wherein the at least one parameter is a supply voltage or a supply current.

3. The device of claim 2, wherein the calibrating points include (i) 69V, 120V, 220V, and 480V for the supply voltage and (ii) 250 mA, 500 mA, 1 A, and 5 A for the supply current.

4. The device of claim 1, wherein the calibrating measurements are performed using certified sources of the at least one parameter.

5. The device of claim 1, wherein the calibrating points are pre-determined calibrating points disposed in an application range of the device for the at least one parameter.

6. The device of claim 1, wherein results of measuring or calculating the at least one parameter are linearly interpolated using data of the calibrating measurements performed at the calibrating frequencies adjacent to an AC frequency of the AC electrical service.

7. The device of claim 1, wherein the plurality of the calibrating frequencies includes 50 Hz and 60 Hz.

8. The device of claim 1, wherein the processing module is further configured to process or store results of the calibrating measurements.

9. The device of claim 1, further comprising a communication module adapted for transmitting to a remote terminal results of the calibrating measurements or results of measuring or calculating the at least one parameter.

10. The device of claim 1, wherein said device is selected from the group consisting of a digital electrical power and energy meter, a Programmable Logic Controller (PLC), a Remote Terminal Unit, a protective relay, or a fault recorder.

11. A method of measuring at least one parameter of an AC electrical service using an intelligent electronic device, comprising:
    performing calibrating measurements of the at least one parameter at a plurality of calibrating points at a plurality of calibrating frequencies using certified sources of the at least one parameter; and
    linearly interpolating results of measuring the at least one parameter using data of the calibrating measurements performed at the calibrating frequencies adjacent to a data point of the at least one parameter.

12. The method of claim 11, wherein the at least one parameter is a supply voltage or a supply current.

13. The method of claim 11, further comprising:
    linearly interpolating results of measuring the at least one parameter using data of the calibrating measurements performed at the calibrating frequencies adjacent to an AC frequency of the AC electrical service.

14. The method of claim 11, wherein the plurality of the calibrating frequencies includes 50 Hz and 60 Hz.

15. An apparatus using the method of claim 14, said apparatus selected from the group consisting of a digital electrical power and energy meter, a Programmable Logic Controller (PLC), a Remote Terminal Unit, a protective relay, or a fault recorder.

16. An intelligent electronic device comprising:
    a sensing circuit having one or more sensors for sensing at least one parameter of an AC electrical service, each of the one or more sensors generating a first signal representative of the sensed parameter;
    a plurality of calibration factors stored in the one or more computer-readable storage devices, the plurality of calibration factors corresponding to a plurality of calibration measurements, the plurality of calibration measurements comprising measurements of a second signal representative of a known value of the parameter at a plurality of signal amplitudes in each of a plurality of calibration signal frequencies; and
    a processor that determines a calibrated value for a measured data point using interpolation of the results of the plurality of calibration measurements.

17. The intelligent electronic device of claim 16, wherein the processor determines at least one additional calibration factor for the measured data point by interpolating two calibration factors, each of the two calibration factors corresponding to a calibration measurement adjacent to the measured data point and applies the at least one additional calibration factor to the measured data point.

18. The intelligent electronic device of claim 17, wherein the processor stores the at least one additional calibration factor in the one or more computer-readable storage devices.

19. The intelligent electronic device of claim 16, wherein the second signal representative of a known value is representative of one of a known voltage and a known current and wherein the plurality of calibration ranges includes 69 V, 120 V, 220 V, and 480 V for second signals representative of a known voltage, and 250 mA, 500 mA, 1 A, and 5 A for second signals representative of a known current.

20. The intelligent electronic device of claim 16, wherein the plurality of calibration signal frequencies includes 50 Hz and 60 Hz.

* * * * *